(12) United States Patent
Chen et al.

(10) Patent No.: US 12,262,588 B2
(45) Date of Patent: Mar. 25, 2025

(54) DISPLAY PANEL HAVING A DIFFRACTION GRATING AND ELECTRONIC DEVICE

(71) Applicant: HUAWEI TECHNOLOGIES CO., LTD., Shenzhen (CN)

(72) Inventors: Dong Chen, Dongguan (CN); Cong Huang, Dongguan (CN); Shipeng Chi, Shenzhen (CN); Ruhai Fu, Dongguan (CN); Hu He, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 238 days.

(21) Appl. No.: 17/775,023

(22) PCT Filed: Nov. 6, 2020

(86) PCT No.: PCT/CN2020/126972
§ 371 (c)(1),
(2) Date: May 6, 2022

(87) PCT Pub. No.: WO2021/088953
PCT Pub. Date: May 14, 2021

(65) Prior Publication Data
US 2022/0392963 A1    Dec. 8, 2022

(30) Foreign Application Priority Data
Nov. 7, 2019 (CN) .......................... 201911083098.0
Nov. 19, 2019 (CN) .......................... 201911136259.8

(51) Int. Cl.
*H10K 59/121* (2023.01)
*H10K 59/126* (2023.01)
*H10K 59/65* (2023.01)

(52) U.S. Cl.
CPC ......... *H10K 59/121* (2023.02); *H10K 59/126* (2023.02); *H10K 59/65* (2023.02)

(58) Field of Classification Search
CPC ..... H10K 59/126; H10K 59/121; H10K 59/65
See application file for complete search history.

(56) References Cited

U.S. PATENT DOCUMENTS

| | | | |
|---|---|---|---|
| 2013/0277534 A1 | 10/2013 | Watanabe | |
| 2014/0048779 A1* | 2/2014 | Lee .................. | H10K 59/126 257/89 |
| 2019/0326366 A1 | 10/2019 | Fan et al. | |

FOREIGN PATENT DOCUMENTS

| | | |
|---|---|---|
| CN | 104465714 A | 3/2015 |
| CN | 105096748 A | 11/2015 |

(Continued)

OTHER PUBLICATIONS

Translation of IDS ref, Tan (CN208507679U).*

*Primary Examiner* — Suberr L Chi
(74) *Attorney, Agent, or Firm* — Rimon PC

(57) ABSTRACT

This application provides a display panel and an electronic device. A display region of the display panel is divided into at least two pixel regions. The pixel region includes at least two subpixels. The display region includes a first display region and a second display region. Subpixel density of the first display region is less than that of the second display region. In the first display region, at least some adjacent pixel regions have different structures. By changing structures of at least some pixel regions in the first display region, an arrangement rule of structures in pixel regions in the first display region is changed to some extent, and form a long-period diffraction grating or an aperiodic diffraction grating, so that a diffraction phenomenon caused by light passing through the display panel can be mitigated.

20 Claims, 17 Drawing Sheets

(56) References Cited

FOREIGN PATENT DOCUMENTS

| | | |
|---|---|---|
| CN | 106471875 A | 3/2017 |
| CN | 107819018 A | 3/2018 |
| CN | 107994054 A | 5/2018 |
| CN | 108336117 A | 7/2018 |
| CN | 208507679 U | 2/2019 |
| CN | 109599053 A | 4/2019 |
| CN | 109742116 A | 5/2019 |
| CN | 109962092 A | 7/2019 |
| CN | 209056269 U | 7/2019 |
| CN | 110085645 A | 8/2019 |
| CN | 110310576 A | 10/2019 |
| CN | 110349989 A | 10/2019 |
| CN | 111383582 A | 7/2020 |
| WO | 2019062236 A1 | 4/2019 |

* cited by examiner

DISPLAY PANEL HAVING A DIFFRACTION GRATING AND ELECTRONIC DEVICE

CROSS-REFERENCE TO RELATED APPLICATIONS

This application is a National Stage of International Application No. PCT/CN2020/126972, filed on Nov. 6, 2020, which claims priority to Chinese Patent Application No. 201911136259.8, filed on Nov. 19, 2019, which claims priority to Chinese Patent Application No. 201911083098.0, filed on Nov. 7, 2019. All of the aforementioned applications are hereby incorporated by reference in their entireties.

TECHNICAL FIELD

This application relates to the field of display technologies, and in particular, to a display panel and an electronic device.

BACKGROUND

With the development of display technologies, people not only require a smooth use experience with the electronic products that they use, but they also have an increasingly high requirement for the visual experience. A high screen-to-body ratio has therefore become a current research direction. With respect to an electronic product, arrangement of an optical element such as a front-facing camera inevitably occupies specific space, thereby affecting a screen-to-body ratio. To increase the screen-to-body ratio and implement a bezel-less screen, researchers have considered an implementation solution with an under-screen optical element.

The optical element is disposed under a film layer at which a light emitting device of a display panel is located, that is, the optical element is disposed in a display region. When display needs to be performed, display can be properly performed at a location of the optical element. When the optical element needs to be used, light passes through the display panel to reach the optical element and is finally used by the optical element. The optical element is disposed under a screen, and light can be used by the optical element only after passing through a film layer structure of the display panel. It is found through evaluation of the current under-screen optical element arrangement solution that an image generated by the under-screen optical element is quite blurry and cannot meet user requirements.

SUMMARY

In view of this, this application provides a display panel and an electronic device, to improve quality of imaging after light passes through a display panel, and improve an optical effect of an under-screen optical element.

According to a first aspect, this application provides a display panel. A display region of the display panel is divided into at least two pixel regions. The pixel region includes at least two subpixels. The display region includes a first display region and a second display region. Subpixel density of the first display region is less than that of the second display region. In the first display region, at least some adjacent pixel regions have different structures.

In the display panel provided in this application, the subpixel density of the first display region is less than that of the second display region. When the display panel is assembled into a display apparatus, an optical element may be disposed under a location corresponding to the first display region. For example, the optical element may be one or more of a camera, an optical fingerprint sensor, a structured optical transmitter, a structured optical receiver, an optical proximity transmitter, an optical proximity receiver, and a time of flight (TOF) device. The subpixel density of the first display region is set to be less than that of the second display region, so that a transmittance of the first display region can be increased, and an amount of light received by the under-screen optical element can be increased. In the display panel provided in this application, some adjacent pixel regions in the first display region may have different structures, or all adjacent pixel regions (that is, any two adjacent pixel regions) in the first display region may have different structures. Compared with a related technology in which a plurality of pixel regions with a same structure are provided in a display region, in this application, an arrangement rule of pixel regions in the first display region can be changed to some extent, thereby mitigating a diffraction phenomenon caused by light passing through the display panel, and improving an optical effect of the under-screen optical element.

In some optional implementations, the first display region includes at least two repetition units arranged in an array, each repetition unit includes at least two pixel regions, and in one repetition unit, at least some adjacent pixel regions have different structures. The repetition unit includes two or more pixel regions. When the repetition unit includes two pixel regions, the two pixel regions have different structures. When the repetition unit includes more than two pixel regions, some adjacent pixel regions may have different structures, and some adjacent pixel regions have a same structure; or any two adjacent pixel regions may have different structures. Short-range aperiodic and long-range periodic arrangement of pixel regions is implemented in the first display region by arranging, in an array in the first display region, the repetition units that each include at least two pixel regions and aperiodically arranging the at least two pixel regions in the repetition unit, thereby mitigating a diffraction phenomenon caused by light passing through the display panel, and improving an optical effect of the under-screen optical element. In addition, the periodic arrangement of the pixel regions can ensure that a mask is subject to a uniform force in an evaporation process, thereby meeting a flatness requirement of the mask and ensuring reliability of the evaporation process.

In some optional implementations, all the pixel regions in the repetition unit are arranged in an array, and at least some of the pixel regions have a same structure as that of adjacent pixel regions in diagonal directions of the pixel regions.

In some optional implementations, in the first display region, any two adjacent pixel regions have different structures.

In some optional implementations, the pixel region includes a light emitting region, one subpixel corresponds to one light emitting region, and in two adjacent pixel regions with different structures, light emitting regions of subpixels have different arrangement structures.

In some optional implementations, that light emitting regions of subpixels have different arrangement structures includes at least one of the following: adjacent light emitting regions have different spacing distances; oblique angles of the light emitting regions relative to a same edge of the display panel are different; the light emitting regions have different shapes; the light emitting regions have different area sizes; and the light emitting regions have different relative locations.

In some optional implementations, in two adjacent pixel regions with different structures, at least one of the pixel regions includes a light shielding structure, the pixel region includes a light emitting region and a non-light-emitting region, one subpixel corresponds to one light emitting region, the non-light-emitting region surrounds the light emitting region, and the light shielding structure overlaps the non-light-emitting region.

In some optional implementations, the subpixel includes a first electrode, a light emitting layer, and a second electrode that are sequentially stacked, and the light shielding structure and the first electrode are made of a same material at a same layer.

In some optional implementations, the two adjacent pixel regions with different structures each include the light shielding structure, and the light shielding structures in the two pixel regions differ in at least one of the following: an area size of the light shielding structure, a shape of the light shielding structure, a quantity of light shielding structures, and relative locations of the light shielding structure and the light emitting region.

In some optional implementations, the pixel region includes a light emitting region and a non-light-emitting region, one subpixel corresponds to one light emitting region, and the non-light-emitting region surrounds the light emitting region; the display region further includes at least two signal lines, and the signal line includes a first signal line segment located in the non-light-emitting region; and two adjacent pixel regions with different structures differ in at least one of the following: a line width of the first signal line segment; a line shape of the first signal line segment; and a spacing between two adjacent first signal line segments.

In some optional implementations, in the second display region, two adjacent pixel regions have a same structure.

According to a second aspect, this application provides an electronic device, including any display panel provided in this application, and further including an optical element, where the optical element is located under the first display region.

The display panel and the electronic device provided in embodiments of this application have the following beneficial effects: In the first display region, at least some adjacent pixel regions have different structures, so that transparent regions of at least some adjacent pixel regions have different shapes. That is, by changing structures of at least some pixel regions in the first display region, an arrangement rule of structures of pixel regions in the first display region is changed to some extent, and a rule of a short-period diffraction grating that uses one pixel region as a period can be broken, to form a long-period diffraction grating or an aperiodic diffraction grating, thereby mitigating a diffraction phenomenon caused by light passing through the display panel, improving the quality of imaging after light passes through the display panel, and improving an optical effect of the under-screen optical element. In addition, in the display panel provided in embodiments of this application, differential design only needs to be performed on structures of at least some pixel regions in the first display region, without affecting pixel density in the first display region.

BRIEF DESCRIPTION OF DRAWINGS

To describe the technical solutions in embodiments of the present invention more clearly, the following briefly describes the accompanying drawings for describing embodiments. It is clear that the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
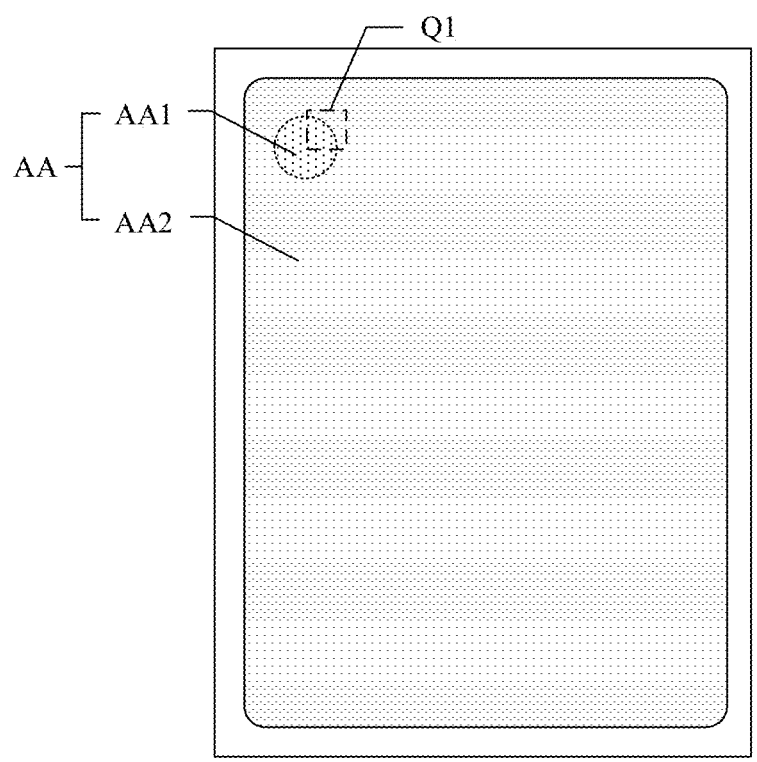
FIG. 1 is a schematic diagram of an optional implementation of a display panel according to an embodiment of this application.

To make the technical solutions in the present invention more comprehensible, the following describes embodiments of the present invention in detail with reference to the accompanying drawings.

It should be clear that the described embodiments are merely some but not all of embodiments of the present invention. All other embodiments obtained by a person of ordinary skill in the art based on embodiments of the present invention without creative efforts shall fall within the protection scope of the present invention.

The terms used in embodiments of the present invention are merely for the purpose of illustrating specific embodiments, and are not intended to limit the present invention. The terms "a", "said" and "the" of singular forms used in embodiments and the appended claims of the present invention are also intended to include plural forms, unless otherwise specified in the context clearly.

It should be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification usually indicates an "or" relationship between the associated objects.

It should be understood that, although terms first, second, and the like may be used to describe apparatuses in embodiments of the present invention, these apparatuses should not be limited to these terms. These terms are merely used to distinguish between the apparatuses. For example, a first apparatus may also be referred to as a second apparatus, and similarly, a second apparatus may also be referred to as a first apparatus, without departing from the scope of embodiments of the present invention.

In a related display technology, an optical element is disposed under a display panel and is located in a display region, that is, a pixel is still arranged above the optical element. When display needs to be performed, display can be properly performed at a location of the optical element. When a function of the optical element is enabled, light is used by the optical element after passing through the display panel. This implements a solution of an under-screen optical element, and can help increase a screen-to-body ratio. The inventor finds that, in the current solution of the under-screen optical element, an obvious diffraction phenomenon occurs when light passes through the display panel, and diffracted light severely affects optical performance of the optical element. For example, the optical element is a camera. A main function of an under-screen camera is photographing or video recording. Definition of an image obtained through imaging by the camera by using diffracted light is quite poor, thereby severely affecting a photographing effect of the camera.

The optical element is disposed under the display region of the display panel, and light can be used by the optical element only after passing through a display layer and an array layer of the display panel. When the light passes through the display panel, a plurality of light emitting devices arranged in the display layer and a pixel circuit and a signal line in the array layer are all equivalent to diffraction gratings, and a diffraction phenomenon occurs when the light passes through the display panel. However, in the related technology, to reduce the difficulty of the fabrication process, pixels with a same structure are used to fabricate the entire panel, that is, pixels with a same structure are arranged in an array in the display region. Correspondingly, pixel circuits in the array layer are also arranged in an array. Through a large amount of experimental research and thinking, the inventor considers that, in the related technology, this is equivalent to forming, in the display region, a short-period regular diffraction grating that uses one pixel as a period, and short-period regular fringe diffraction occurs when light passes through the display panel, thereby severely affecting optical performance of the optical element.

In view of this, this application provides a display panel and an electronic device. In a display region corresponding to an optical element (that is, a first display region in this application), at least some adjacent pixel regions are arranged to have different structures, so that transparent regions of at least some adjacent pixel regions have different shapes. That is, by changing structures of at least some adjacent pixel regions, an arrangement rule of pixel regions in the first display region is changed to some extent, and at least some short-period regular diffraction gratings can be broken, to increase a period length of a grating or form an aperiodic grating, thereby mitigating a diffraction phenomenon caused by light passing through the display panel, and improving an optical effect of an under-screen optical element.

Figure 2:
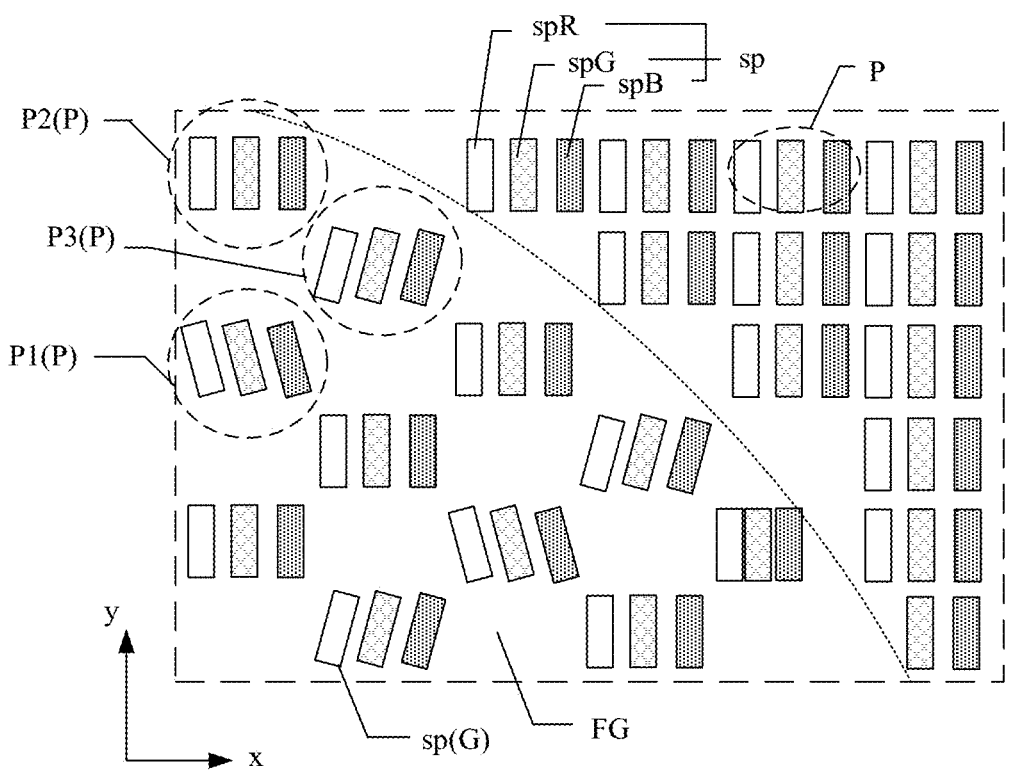
FIG. 2 is a partial enlarged view of a location Q1 in FIG. 1.
Figure 3:
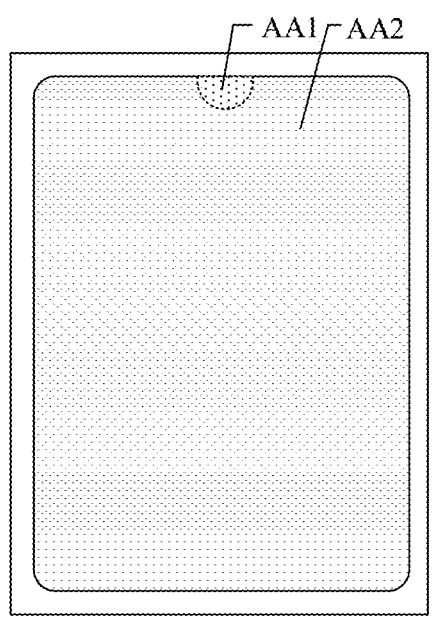
FIG. 3 is a schematic diagram of another optional implementation of a display panel according to an embodiment of this application.
Figure 4:
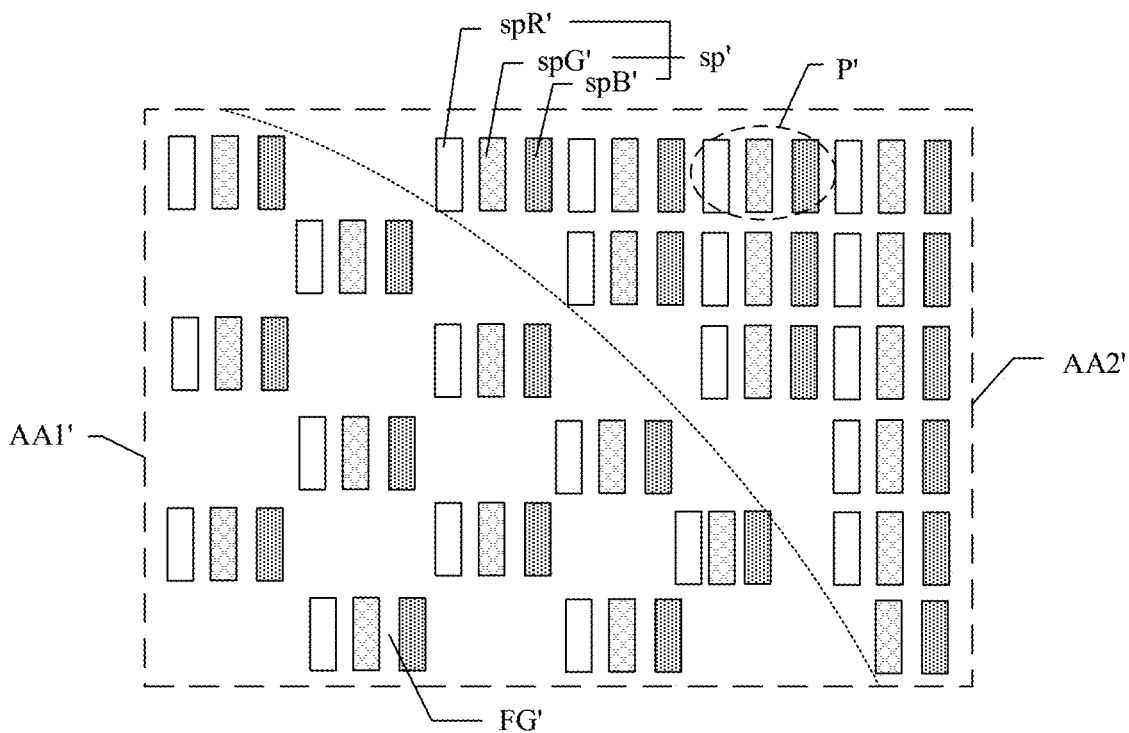
FIG. 4 is a partial schematic diagram of a display panel in a related technology.

FIG. 1 is a schematic diagram of an optional implementation of a display panel according to an embodiment of this application. FIG. 2 is a partial enlarged view of a location Q1 in FIG. 1. FIG. 3 is a schematic diagram of another optional implementation of a display panel according to an embodiment of this application. FIG. 4 is a partial schematic diagram of a display panel in a related technology.

As shown in FIG. 1, a display region AA includes a first display region AA1 and a second display region AA2, a subpixel density of the first display region AA1 is less than that of the second display region AA2, and the subpixel density is a quantity of subpixels in a unit area. When the display panel is assembled into an electronic device, an optical element may be disposed under a location corresponding to the first display region AA1. For example, the optical element may be one or more of a camera, an optical fingerprint sensor, a structured optical transmitter, a structured optical receiver, an optical proximity transmitter, an optical proximity receiver, and a time of flight (TOF) device. The subpixel density of the first display region AA1 is set to be less than that of the second display region AA2, so that a transmittance of the first display region AA1 can be increased, and an amount of light received by the under-screen optical element can be increased. In this embodiment of this application, a shape of the first display region AA1 is not limited, and a shape of the first display region AA1 may be a circular shape, a semicircular shape, a triangular shape, a rectangular shape, or any polygonal shape. A relative location relationship between the first display region AA1 and the second display region AA2 is not limited either. FIG. 1 shows only that the second display region AA2 surrounds the first display region AA1. As shown in FIG. 3, the second display region AA2 may alternatively half-surround the first display region AA1.

As shown in FIG. 2, the display region AA of the display panel is divided into a plurality of pixel regions P, and the pixel region P includes at least two subpixels sp. As shown in the figure, one pixel region P includes a subpixel spR for emitting red light, a subpixel spB for emitting blue light, and a subpixel spG for emitting green light, and three subpixels are shown in total. Optionally, one pixel region P may further include a subpixel for emitting white light, or one pixel region includes only subpixels of two different colors. This is not shown in the figure herein. It can be learned from FIG. 2 that the subpixel density of the first display region AA1 is less than that of the second display region AA2.

It should be noted that the pixel region in this embodiment of this application is a region including several adjacent subpixels and structures near the subpixels. In an embodiment, one pixel region includes two subpixels. In another embodiment, one pixel region includes three subpixels. In another embodiment, one pixel region may alternatively include four subpixels. This embodiment of this application is described by using an example in which one pixel region includes three subpixels. Other cases may be understood with reference to this.

In the first display region AA1, at least some adjacent pixel regions P have different structures. The structures in this application include but are not limited to an arrangement structure of light emitting regions of subpixels in a pixel region, a composition structure of a pixel region, and an arrangement structure of signal lines in a pixel region. The arrangement structure of light emitting regions of subpixels includes at least one of a spacing distance between the light emitting regions of the subpixels, oblique angles of the light emitting regions of the subpixels relative to a same edge of the display panel, shapes of the light emitting regions of the subpixels, and area sizes of the light emitting regions of the subpixels. A composition structure of a pixel region may be that, in addition to subpixels, the pixel region may further include another structure, for example, a light shielding structure. In FIG. 2, different structures are illustrated only by using different oblique angles of light emitting regions of subpixels relative to a same edge of the display panel.

It should be noted that the display panel provided in this application may be an organic light emitting display panel, and the display panel includes a substrate, an array layer, and a display layer that are sequentially stacked. The display layer includes a plurality of organic light emitting devices, and the organic light emitting device includes an anode, a light emitting layer, and a cathode. The plurality of organic light emitting devices include at least a light emitting device configured to emit red light, a light emitting device configured to emit green light, and a light emitting device configured to emit blue light. One organic light emitting device corresponds to one subpixel. During display, voltages are applied to the anode and the cathode, and then the light emitting layer is excited to emit light, so that the subpixel emits light. Therefore, a shape and a size of a light emitting region of the subpixel usually correspond to a shape and a size of the light emitting layer. Still with reference to FIG. 2, the pixel region includes a plurality of light emitting regions G and non-light-emitting regions FG. The light emitting region G is a region, of the subpixel sp, that can emit light. In FIG. 2, the subpixel sp is illustrated only by using a shape of the light emitting region G. The non-light-emitting region FG is a region that surrounds the light emitting region G. Usually, to improve light emitting efficiency of the subpixel sp, the anode of the organic light emitting device is correspondingly set to be a reflective anode. Light emitted by the light emitting layer is irradiated to the reflective anode and reflected by the anode, and then exits from the cathode. Therefore, a transmittance of the anode is quite low. It is usually considered that the anode is opaque, that is, the light emitting region G is opaque. Therefore, when the display panel provided in this application is applied to the solution of the under-screen optical element, light can be used by the optical element only after passing through the non-light-emitting region FG. However, a plurality of pixel circuits and a plurality of signal lines are further disposed in the array layer, and the pixel circuits and the signal lines cannot be completely blocked by the organic light emitting device. Therefore, there are a plurality of signal lines between two adjacent light emitting regions G, and these signal lines also shield light to some extent. Therefore, the non-light-emitting region FG is not a completely transparent region. A gap between signal lines in the non-light-emitting region FG can also form a diffraction grating, to diffract, to some extent, light that passes through the display panel. Because wiring in the non-light-emitting region FG is relatively complex, only text descriptions are provided herein, and no illustration is shown in FIG. 2.

The design manner of the display panel in the related technology shown in FIG. 4 shows a partial display region AA1' and a partial display region AA2', and subpixel density of the display region AA1' is less than that of the display region AA2'. Pixel regions P' in the display region AA1' are arranged regularly, and the pixel regions P' have a same structure. One pixel region P' includes a subpixel spR' for emitting red light, a subpixel spB' for emitting blue light, and a subpixel spG' for emitting green light. The inventor considers that, in the related technology, each pixel region P' is equivalent to one diffraction grating. Because the pixel regions P' have a same structure, wiring arrangements in non-light-emitting regions FG' corresponding to the pixel regions P' are also substantially the same. When the display panel shown in FIG. 4 is applied to the solution of the under-screen optical element, this is equivalent to forming a short-period regular diffraction grating that uses one pixel region P' as a period, and short-period regular fringe diffraction occurs when light passes through the display panel, thereby severely affecting optical performance of the optical element.

Still with reference to FIG. 2, a first direction x and a second direction y perpendicular to each other are shown. For example, the display panel includes an edge extending in the second direction y (the figure is a partial schematic diagram, and does not show edges of the display panel), and all subpixels have a strip-shaped structure. All three subpixels sp in a pixel region P1 are inclined at a specific angle relative to the second direction y. Three subpixels sp in a pixel region P2 adjacent to the pixel region P1 in the second direction y are substantially not inclined relative to the second direction y. The pixel region P1 and the pixel region P2 that are adjacent in the second direction y have different structures. Three subpixels sp in a pixel region P3 are also inclined at a specific angle relative to the second direction y, but a direction in which the three subpixels sp in the pixel region P3 are inclined relative to the second direction y is opposite to a direction in which the three subpixels sp in the pixel region P1 are inclined relative to the second direction y. Therefore, the pixel region P3 and the pixel region P1 have different structures. As shown in the figure, there is no pixel region P between the pixel region P3 and the pixel region P1, and therefore the pixel region P3 and the pixel region P1 are also two adjacent pixel regions with different structures. Similarly, the pixel region P2 and the pixel region P3 are also two adjacent pixel regions with different structures. As shown in FIG. 2, the adjacent pixel region P1 and pixel region P2 are used as examples. After the pixel region P1 and the pixel region P2 are set to have different structures, shapes of non-light-emitting regions FG corresponding to the pixel region P1 and the pixel region P2 are changed. In addition, lengths or quantities of wires exposed in the non-light-emitting regions FG are also changed accordingly. Therefore, shapes of corresponding transparent regions in the non-light-emitting regions FG are changed accordingly. In this case, the pixel region P1 and the pixel region P2 form two different diffraction gratings. Therefore, in the display panel provided in this application, one pixel region is no longer used as a period of a diffraction grating, and a rule of a short-period diffraction grating that uses one pixel region as a period is broken.

In the display panel provided in this embodiment of this application, at least some adjacent pixel regions in the first display region have different structures. By changing structures of at least some pixel regions in the first display region, an arrangement rule of structures of pixel regions in the first display region is changed to some extent, and a rule of a short-period diffraction grating that uses one pixel region as a period can be broken. Regular differential design may be performed on structures of pixel regions in the first display region to increase a period length of a diffraction grating, or differential design may be performed on structures of pixel regions in the first display region to implement an aperiodic diffraction grating, thereby mitigating a diffraction phenomenon caused by light passing through the display panel, and improving an optical effect of the under-screen optical element. In addition, in the display panel provided in embodiments of this application, differential design only needs to be performed on structures of at least some pixel regions in the first display region, without affecting subpixel density in the first display region.

It should be noted that FIG. 2 shows only a case in which some adjacent pixel regions P have different structures. Optionally, any two adjacent pixel regions P may have different structures. In this case, non-adjacent pixel regions may have a same structure. This is described in detail in the following specific implementations.

Figure 5:
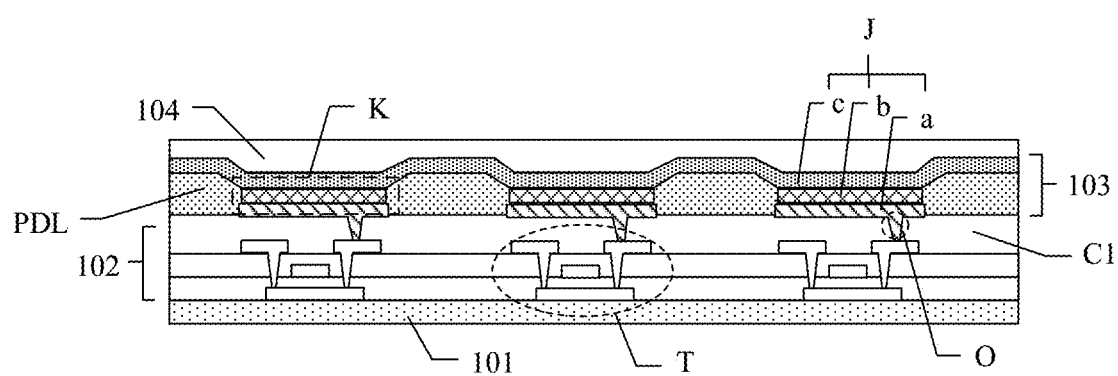
FIG. 5 is a partial schematic diagram of a film layer structure in an optional implementation of a display panel according to an embodiment of this application.

FIG. 5 is a partial schematic diagram of a film layer structure in an optional implementation of a display panel according to an embodiment of this application. As shown in FIG. 5, the display panel includes a substrate 101, an array layer 102, and a display layer 103. The display layer 103 includes an organic light emitting device J, and the organic light emitting device J includes an anode a, a light emitting layer b, and a cathode c. The organic light emitting device J includes at least a light emitting device configured to emit red light, a light emitting device configured to emit green light, and a light emitting device configured to emit blue light. This is not distinguished in the figure. Optionally, the organic light emitting device J further includes at least one of a hole transport layer, an electron transport layer, a hole injection layer, and an electron injection layer. This is not shown in the figure. The display layer 103 further includes a pixel definition layer PDL. The pixel definition layer PDL includes a plurality of openings K. One opening K corresponds to one organic light emitting device J. The pixel definition layer PDL is configured to space the organic light emitting devices J. The array layer 102 includes a plurality of pixel circuits. The pixel circuit is electrically connected to the anode a of the organic light emitting device J. The figure shows only one transistor T in the pixel circuit. The figure shows only a transistor with a top gate structure. Optionally, the transistor T may alternatively have a bottom gate structure. This is not shown in the figure herein. A packaging structure 104 is further disposed on the display layer 103. The packaging structure 104 is configured to block dissolved oxygen, to prevent the dissolved oxygen from damaging the organic light emitting device J, and ensuring a service life of the organic light emitting device J. The packaging structure 104 may be a thin film package, including at least one organic layer and at least one inorganic layer.

The display panel provided in this embodiment of this application may be fabricated by using the following fabrication method: First, the substrate 101 is fabricated. Then the array layer 102 is fabricated on the substrate 101. The array layer 102 includes at least a semiconductor active layer, a gate metal layer, a source-drain metal layer, and an insulation layer between metal layers. The array layer 102 is fabricated by using a fabrication process in a conventional technology. For example, an active layer, a gate, a source, and a drain of the transistor T are sequentially fabricated by a using a fabrication process of gluing, exposure, developing, and etching. After the source and the drain of the transistor are fabricated, an insulation layer C1 is fabricated, and the insulation layer C1 may be a flattened layer. The insulation layer C1 is etched to form a via O for exposing the drain. Then the anode a of the organic light emitting device is fabricated on the insulation layer C1. The anode a is also fabricated by using an etching process. The anode a is electrically connected to the drain of the transistor T through the via O. Then a whole pixel definition layer PDL is formed on the anode a, and the pixel definition layer PDL is etched to form the opening K for exposing the anode. Then the light emitting layer b and other organic film layers are fabricated by using an evaporation process. When the light emitting layer b is evaporated, one mask is used to evaporate openings K corresponding to light emitting devices that emit light of a same color. Other organic film layers such as the hole transport layer in the organic light emitting device are also fabricated by using the evaporation process. After the organic layer is evaporated, a whole cathode layer is usually deposited.

In an embodiment, in the display panel provided in this embodiment of this application, two adjacent pixel regions in the second display region have a same structure. Still with reference to the partial region of the second display region AA2 shown in FIG. 2, two adjacent pixel regions P in the second display region AA2 have a same structure. That is, a plurality of pixel regions in the second display region AA2 are still periodically arranged by using one pixel region as a period. In this embodiment, only structures of pixel regions in the first display region AA1 are changed, and structures of pixel regions in the second display region AA2 are not changed. The subpixel density of the first display region is set to decrease, and at least some adjacent pixel regions in the first display region have different structures, thereby increasing a transmittance of the first display region, and breaking an arrangement rule of using one pixel region as a period in at least some regions. When the display panel provided in this embodiment is applied to the solution of the under-screen optical element, an amount of light received by the optical element can be increased, and a diffraction phenomenon caused by light passing through the display panel is also mitigated, thereby improving optical performance of the optical element.

In the display panel provided in this embodiment of this application, when an arrangement structure of light emitting regions of subpixels in the first display region is changed to implement different structures of two adjacent pixel regions, this can be implemented by correspondingly adjusting a mask used in an anode etching process and a mask used in a pixel definition layer etching process. After the two masks are correspondingly adjusted and designed, an arrangement structure of light emitting regions of subpixels in a pixel region can be changed. In this way, any one of a spacing distance between the light emitting regions of the subpixels, oblique angles of the light emitting regions of the subpixels relative to a same edge of the display panel, shapes of the light emitting regions of the subpixels, or area sizes of the light emitting regions of the subpixels can be adjusted, so that two adjacent pixel regions can have different structures. When a composition structure of a pixel region in the first display region is changed to implement different structures of two adjacent pixel regions, this can be implemented by adding a corresponding fabrication process to the foregoing fabrication process to add a new structure, or by designing a mask to change shapes of some existing film layer structures. When an arrangement structure of signal lines in a pixel region in the first display region is changed to implement different structures of two adjacent pixel regions, this can be implemented by designing a mask used in a signal line fabrication process.

In some optional implementations, in the display panel provided in this embodiment of this application, the pixel region includes a light emitting region, one subpixel corresponds to one light emitting region, and in two adjacent pixel regions with different structures, light emitting regions of subpixels have different arrangement structures. An arrangement structure of light emitting regions of subpixels is adjusted to implement different structures of two adjacent pixel regions. When an arrangement structure of light emitting regions of subpixels in a pixel region is changed, a shape of a non-light-emitting region corresponding to the pixel region is changed, and a quantity or a length of wires in an array layer corresponding to the non-light-emitting region is also changed accordingly. This breaks a rule of a short-period diffraction grating that uses one pixel region as a period, mitigates a diffraction phenomenon caused by light passing through the display panel, and improves an optical effect of the under-screen optical element.

Optionally, in the display panel provided in this embodiment of this application, that light emitting regions of subpixels have different arrangement structures includes at least one of the following: adjacent light emitting regions have different spacing distances; oblique angles of the light emitting regions relative to a same edge of the display panel are different; the light emitting regions have different shapes; the light emitting regions have different area sizes; and the light emitting regions have different relative locations. Specific implementations of adjusting an arrangement structure of light emitting regions of subpixels to implement different structures of two adjacent pixel regions are described in the following embodiments by using examples.

Figure 6:
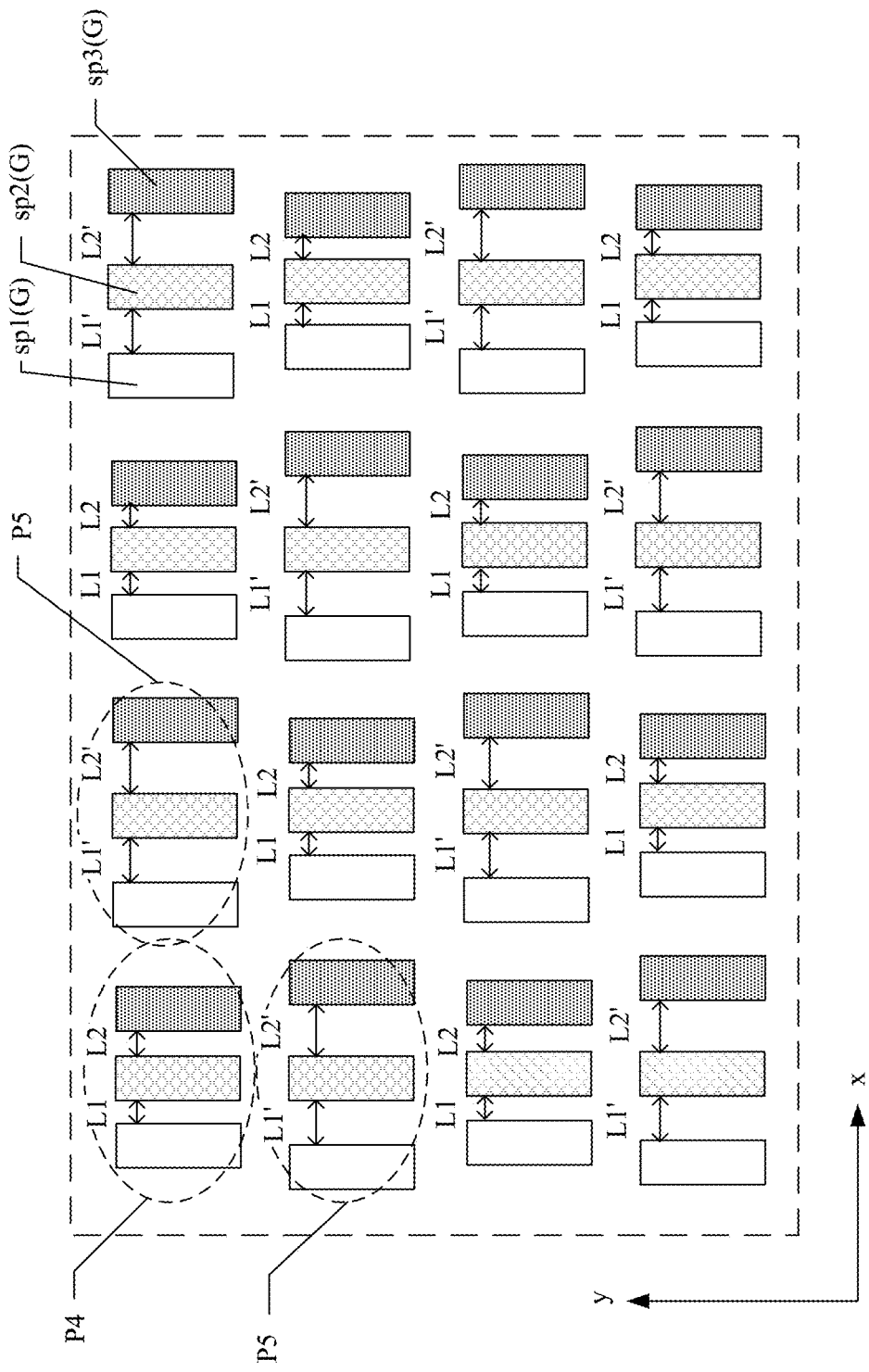
FIG. 6 is a partial schematic top view of an optional implementation of a first display region of a display panel according to an embodiment of this application.

In an embodiment, a spacing distance between two adjacent light emitting regions in a pixel region is adjusted to adjust an arrangement structure of light emitting regions of subpixels in a pixel region, so as to implement different structures of two adjacent pixel regions. FIG. 6 is a partial schematic top view of an optional implementation of a first display region of a display panel according to an embodiment of this application. As shown in FIG. 6, a pixel region includes a light emitting region G, and one subpixel sp corresponds to one light emitting region G. In the figure, the subpixel sp is illustrated only by using a shape of the light emitting region G. As shown in the figure, one pixel region P includes three subpixels: sp1, sp2, and sp3, and the subpixels sp1, sp2, and sp3 respectively emit light of different colors. As shown in the figure, three subpixels in a pixel region are arranged in a first direction x, and all the three subpixels have a strip-shaped structure. A spacing distance between light emitting regions G of two subpixels in a pixel region is a spacing between the light emitting regions G of the two subpixels in the first direction x. In a pixel region P4, a spacing distance between a light emitting region G of a subpixel sp1 and a light emitting region G of a subpixel sp2 is L1, and a spacing distance between the light emitting region G of the subpixel sp2 and a light emitting region G of a subpixel sp3 is L2. In a pixel region P5, a spacing distance between a light emitting region G of a subpixel sp1 and a light emitting region G of a subpixel sp2 is L1', and a spacing distance between the light emitting region G of the subpixel sp2 and a light emitting region G of a subpixel sp3 is L2'. L1≠L1', and L2≠L2'. Arrangement structures of subpixels in the adjacent pixel regions P4 and P5 are different. Optionally, in this implementation, L1 and L2 may or may not be equal. Similarly, L1' and L2' may or may not be equal. As shown in the figure, the pixel region P4 is adjacent to the pixel region P5 in both the first direction x and a second direction y.

As shown in the embodiment corresponding to FIG. 6, in two adjacent pixel regions, spacing distances between adjacent light emitting regions in the pixel regions are set to be different, so that arrangement structures of light emitting regions of subpixels in the two adjacent pixel regions are different, and structures of the two adjacent pixel regions are different. This breaks a rule of a short-period diffraction grating that uses one pixel region as a period, to mitigate a diffraction phenomenon caused by light passing through the display panel. For example, one pixel region includes three subpixels. As shown in FIG. 6, the three subpixels sp are sequentially arranged in the first direction x. In this case, in one pixel region, spacing distances between two adjacent light emitting regions G include at least two spacing distances: the spacing distance between the light emitting region G of the subpixel sp1 and the light emitting region G of the subpixel sp2, and the spacing distance between the light emitting region G of the subpixel sp2 and the light emitting region G of the subpixel sp3. As shown in the embodiment of FIG. 6, in two adjacent pixel regions, the two corresponding spacing distances are both different. In another implementation, in two adjacent pixel regions, one corresponding spacing distance is different, and the other spacing distance is the same. For example, in two adjacent pixel regions, the spacing distance between the light emitting region G of the subpixel sp1 and the light emitting region G of the subpixel sp2 is different, and the spacing distance between the light emitting region G of the subpixel sp2 and the light emitting region G of the subpixel sp3 is the same.

Figure 7:
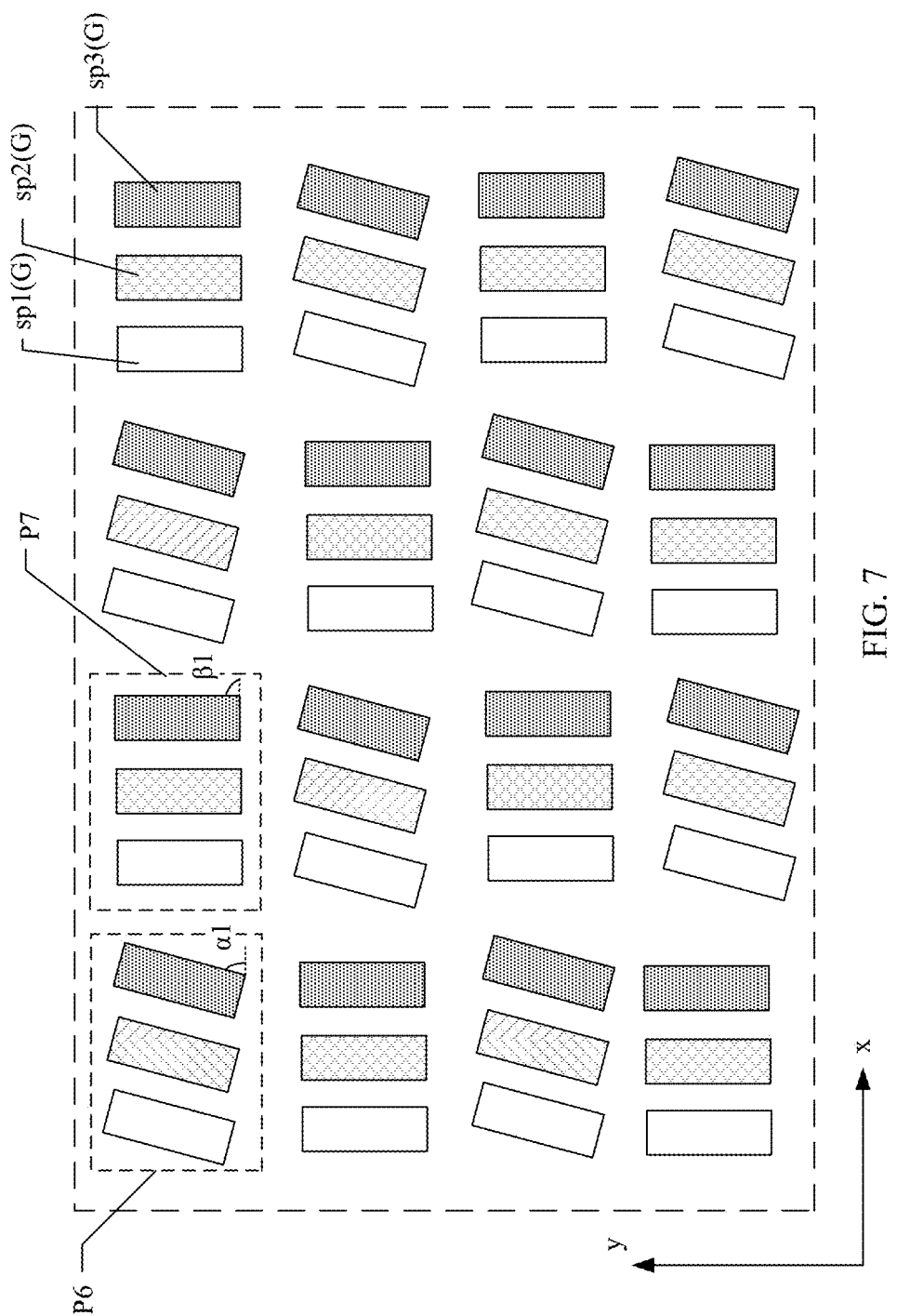
FIG. 7 is a partial schematic top view of another optional implementation of a first display region of a display panel according to an embodiment of this application.

In an embodiment, oblique angles of light emitting regions of subpixels in a pixel region relative to a same edge of the display panel are adjusted to adjust an arrangement structure of the light emitting regions of the subpixels in the pixel region, so as to implement different structures of two adjacent pixel regions. FIG. 7 is a partial schematic top view of another optional implementation of a first display region of a display panel according to an embodiment of this application. As shown in FIG. 7, a subpixel sp is illustrated by using a shape of a light emitting region G, one pixel region includes three subpixels: sp1, sp2, and sp3, and all the three subpixels have a strip-shaped structure. For example, an extension direction of an edge of the display panel is the same as a first direction x shown in FIG. 7 (the figure is a partial schematic diagram, and does not show edges of the display panel). In the figure, an oblique angle of a light emitting region G of a subpixel in a pixel region P6 relative to the first direction xis α1, and an oblique angle of a light emitting region G of a subpixel in a pixel region P7 relative to the first direction x is β1, where α1≠β1. That is, oblique angles of light emitting regions in the adjacent pixel regions P6 and P7 relative to a same edge of the display panel are different, and therefore arrangement structures of subpixels in the adjacent pixel regions P6 and P7 are different. In this embodiment, optionally, β1=90°.

Figure 8:
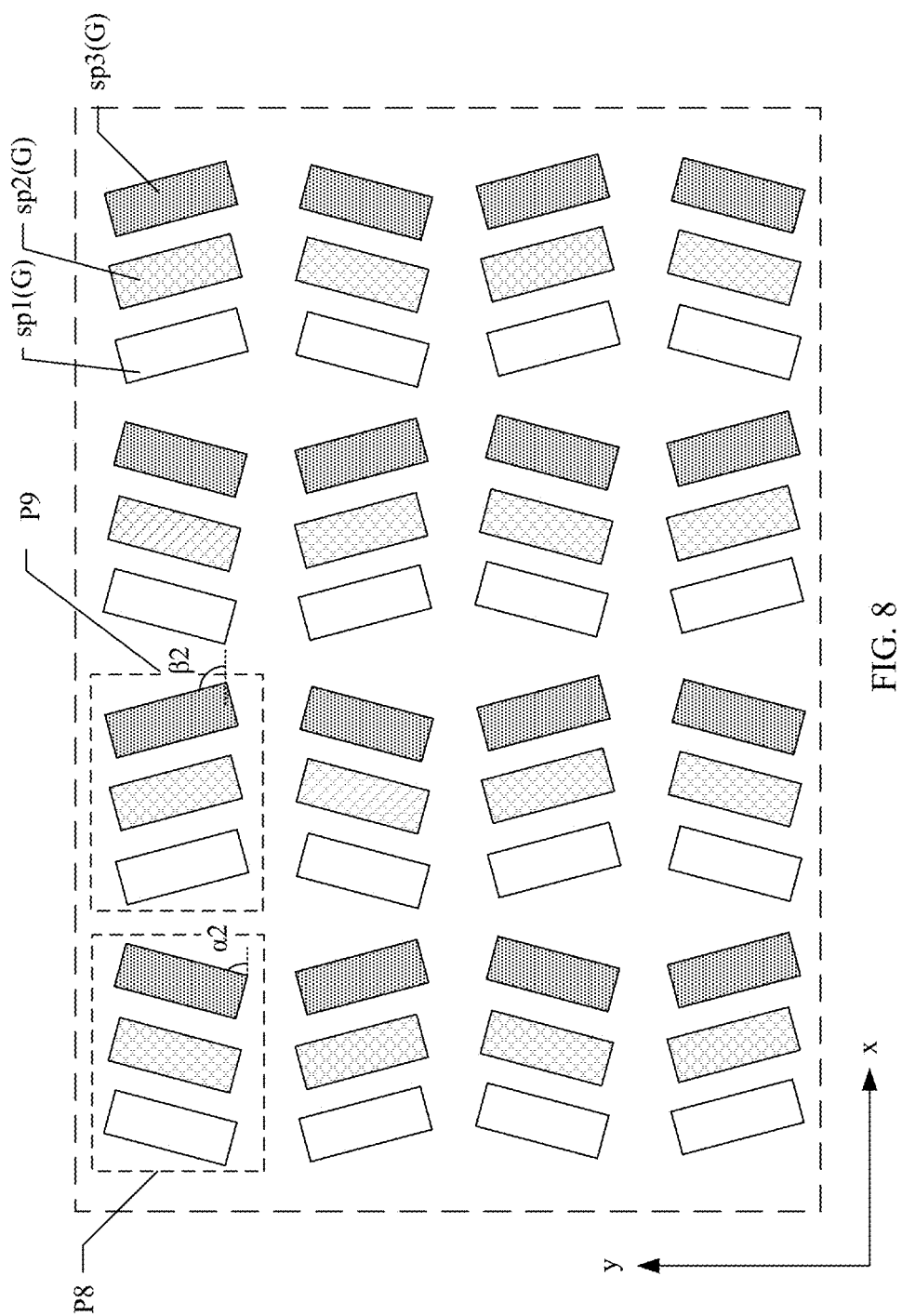
FIG. 8 is a partial schematic top view of another optional implementation of a first display region of a display panel according to an embodiment of this application.

In an embodiment, FIG. 8 is a partial schematic top view of another optional implementation of a first display region of a display panel according to an embodiment of this application. As shown in FIG. 8, a subpixel sp is illustrated by using a shape of a light emitting region G, one pixel region includes three subpixels: sp1, sp2, and sp3, and all the three subpixels have a strip-shaped structure. For example, an extension direction of an edge of the display panel is the same as a first direction x shown in FIG. 8. In the figure, an oblique angle of a light emitting region G of a subpixel in a pixel region P8 relative to the first direction x is α2, and an oblique angle of a light emitting region G of a subpixel in a pixel region P9 relative to the first direction x is β2, where α2≠β2. That is, oblique angles of light emitting regions in the adjacent pixel regions P8 and P9 relative to a same edge of the display panel are different, and therefore arrangement structures of subpixels in the adjacent pixel regions P8 and P9 are different.

As shown in the embodiments corresponding to FIG. 7 and FIG. 8, oblique angles of light emitting regions in two adjacent pixel regions relative to a same edge of the display panel are adjusted to implement different arrangement structures of light emitting regions of subpixels in the two adjacent pixel regions, and implement different structures of the two adjacent pixel regions. Both FIG. 7 and FIG. 8 show a case in which oblique angles of light emitting regions of all subpixels in one pixel region relative to a same edge of the display panel are the same. In some optional implementations, in two adjacent pixel regions with different structures, oblique angles of light emitting regions of all subpixels in one pixel region relative to a same edge of the display panel are not exactly the same.

Figure 9:
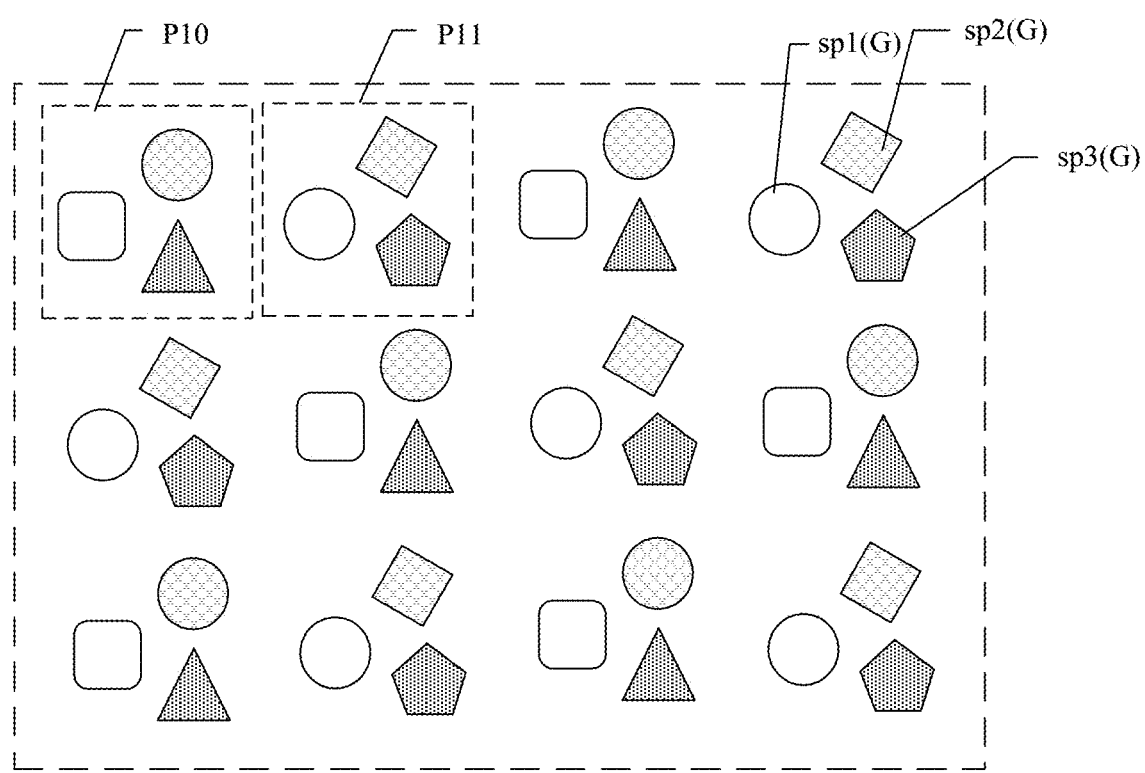
FIG. 9 is a partial schematic top view of another optional implementation of a first display region of a display panel according to an embodiment of this application.

In an embodiment, shapes of light emitting regions of subpixels in a pixel region are adjusted to adjust an arrangement structure of the light emitting regions of the subpixels in the pixel region, so as to implement different structures of two adjacent pixel regions. FIG. 9 is a partial schematic top view of another optional implementation of a first display region of a display panel according to an embodiment of this application. As shown in FIG. 9, a subpixel sp is illustrated by using a shape of a light emitting region G, and one pixel region includes three subpixels: sp1, sp2, and sp3. As shown in the figure, for example, three subpixels in a pixel region are arranged in a triangular shape, and the three subpixels sp1, sp2, and sp3 respectively occupy three vertexes of a triangle. A shape of a light emitting region G of a corresponding subpixel sp1, a shape of a light emitting region G of a corresponding subpixel sp2, and a shape of a light emitting region G of a corresponding subpixel sp3 vary in a pixel region P10 and a pixel region P11. Arrangement structures of subpixels in the adjacent pixel regions P10 and P11 are different.

It should be noted that, in the embodiment of FIG. 9, a same type of subpixel is indicated by a same filling pattern, but not by a same shape. In addition, shapes of subpixels in FIG. 9 are merely used for illustration, and are not intended to limit this embodiment of this application. In the implementation of adjusting shapes of light emitting regions in a pixel region to adjust an arrangement structure of light emitting regions of subpixels, a shape of a subpixel may be designed according to a specific design requirement and process requirement.

As shown in the embodiment corresponding to FIG. 9, in two adjacent pixel regions, all light emitting regions of correspondingly arranged subpixels have different shapes, so that structures of the two pixel regions are different. In another embodiment, in two adjacent pixel regions, light emitting regions of some corresponding subpixels have different shapes, and light emitting regions of remaining corresponding subpixels have a same shape. For example, as shown in FIG. 9, three subpixels in one pixel region are arranged in a triangular shape. In two adjacent pixel regions, light emitting regions of corresponding subpixels sp1 may have different shapes, light emitting regions of corresponding subpixels sp2 may have different shapes, and light emitting regions of corresponding subpixels sp3 may have a same shape.

In an embodiment, in two adjacent pixel regions with different structures, all or some of subpixels that belong to one pixel region may have a same shape. This is not shown in the figure herein.

Figure 10:
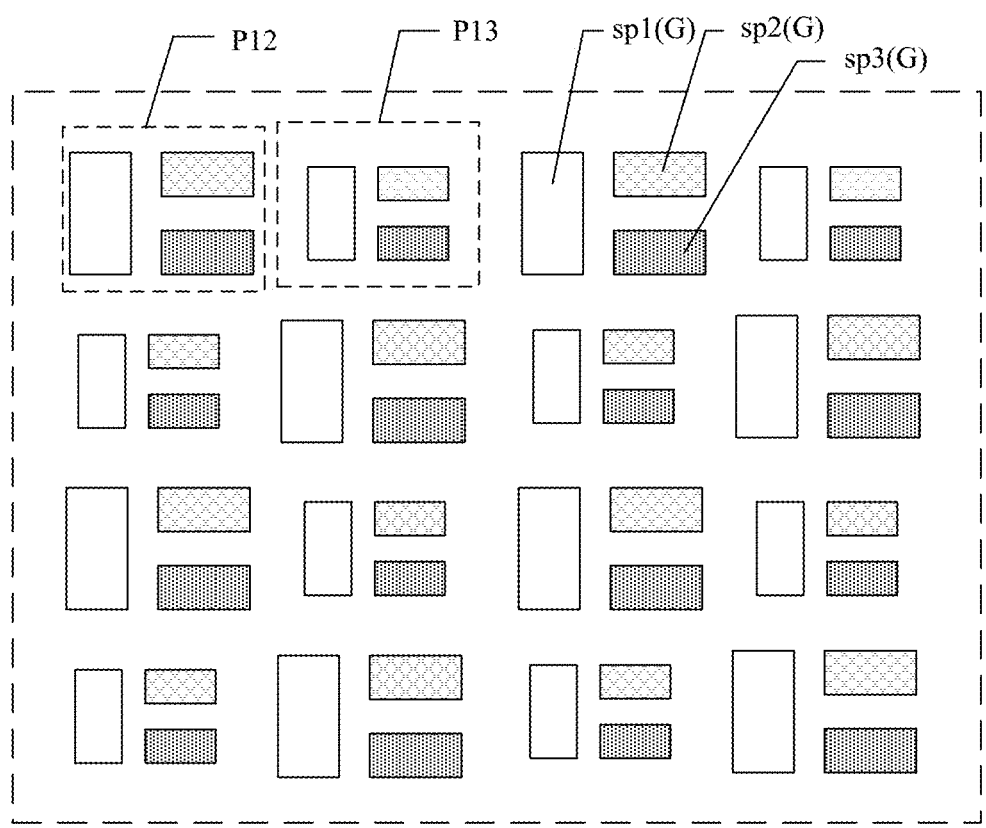
FIG. 10 is a partial schematic top view of another optional implementation of a first display region of a display panel according to an embodiment of this application.

In an embodiment, area sizes of light emitting regions of subpixels in a pixel region are adjusted to adjust an arrangement structure of the light emitting regions of the subpixels in the pixel region, so as to implement different structures of two adjacent pixel regions. FIG. 10 is a partial schematic top view of another optional implementation of a first display region of a display panel according to an embodiment of this application. As shown in FIG. 10, a subpixel sp is illustrated by using a shape of a light emitting region G, and one pixel region includes three subpixels: sp1, sp2, and sp3. An area of a light emitting region G of each of three subpixels in a pixel region P12 is greater than an area of a light emitting region G of each of corresponding three subpixels in a pixel region P13. Arrangement structures of subpixels in the adjacent pixel regions P12 and P13 are different. It should be noted that the arrangement of light emitting regions of subpixels in a pixel region in FIG. 10 is merely used for illustration, and is not intended to limit this application. The implementation of adjusting area sizes of light emitting regions of subpixels in a pixel region to adjust an arrangement structure of the subpixels is applicable to any subpixel arrangement that can be implemented.

As shown in FIG. 10, in two adjacent pixel regions, an area of a light emitting region of each of three subpixels in a pixel region is greater than an area of a light emitting region of each of corresponding three subpixels in another pixel region.

In another embodiment, in two adjacent pixel regions with different structures, an area of a light emitting region of each of two subpixels is correspondingly the same, and an area of a light emitting region of one subpixel correspondingly varies.

In another embodiment, in two adjacent pixel regions with different structures, an area of a light emitting region of one subpixel is correspondingly the same, and an area of a light emitting region of each of two subpixels correspondingly varies.

Figure 11:
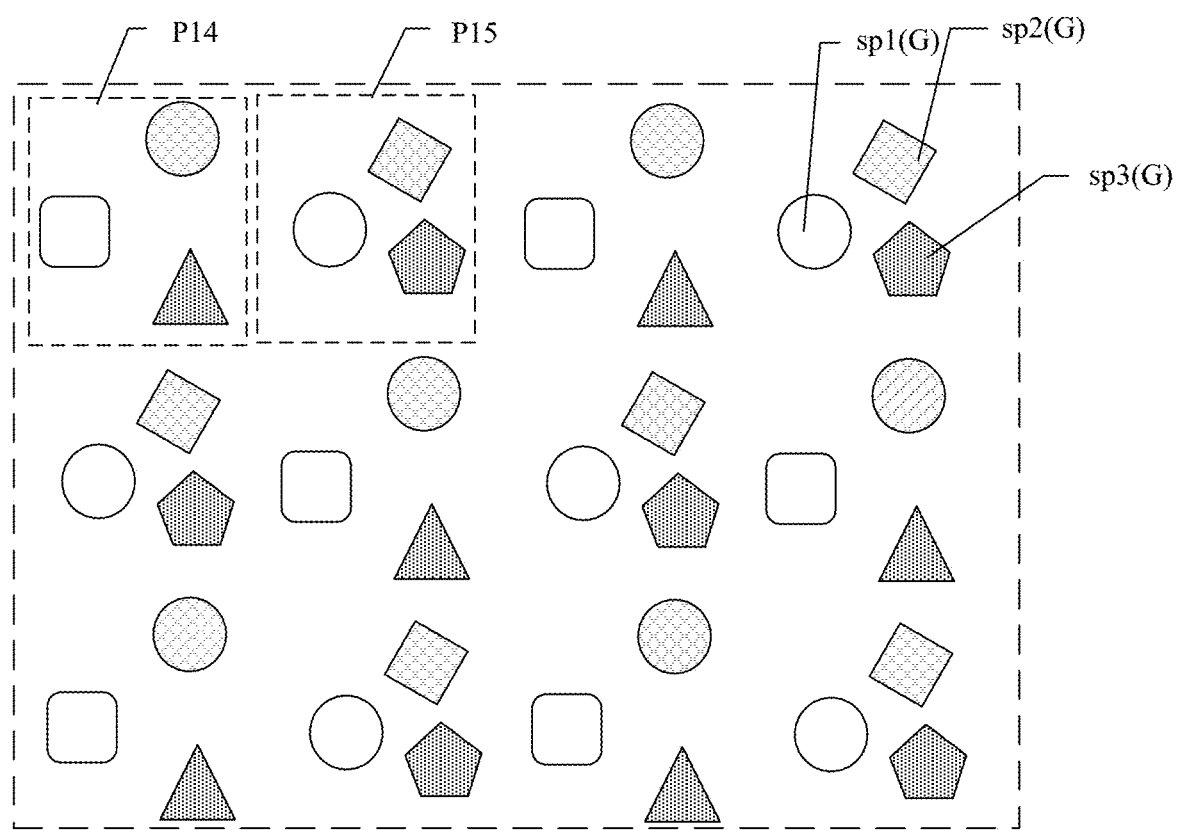
FIG. 11 is a partial schematic top view of another optional implementation of a first display region of a display panel according to an embodiment of this application.

In an embodiment, FIG. 11 is a partial schematic top view of another optional implementation of a first display region of a display panel according to an embodiment of this application. As shown in FIG. 11, a subpixel sp is illustrated by using a shape of a light emitting region G, and one pixel region includes three subpixels: sp1, sp2, and sp3. A shape of a light emitting region G of a corresponding subpixel sp1, a shape of a light emitting region G of a corresponding subpixel sp2, and a shape of a light emitting region G of a corresponding subpixel sp3 vary in a pixel region P14 and a pixel region P15. In addition, in the pixel region P14 and the pixel region P15, corresponding adjacent light emitting regions also have different spacing distances. Arrangement structures of light emitting regions of subpixels in the pixel region P14 and the pixel region P15 are different. In this embodiment, a spacing distance between two adjacent light emitting regions and a shape of a light emitting region are both adjusted to adjust an arrangement structure of light emitting regions of subpixels, so as to implement different structures of two adjacent pixel regions.

Figure 12:
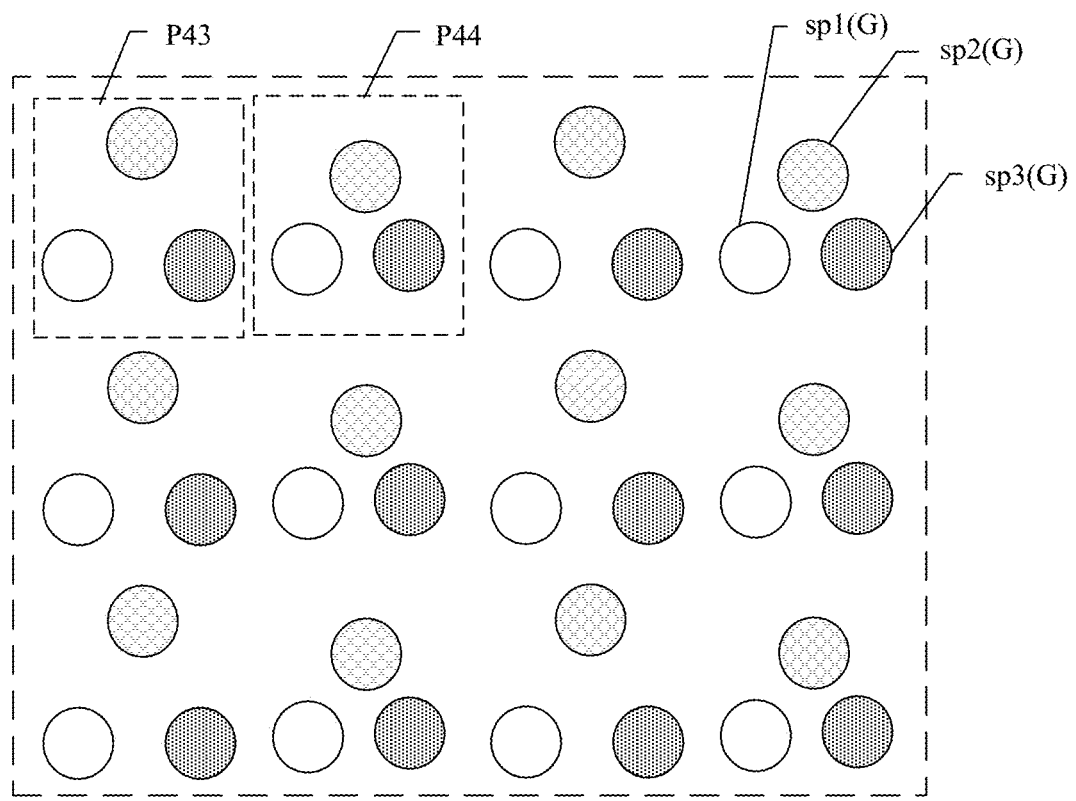
FIG. 12 is a partial schematic top view of another optional implementation of a first display region of a display panel according to an embodiment of this application.

In an embodiment, FIG. 12 is a partial schematic top view of another optional implementation of a first display region of a display panel according to an embodiment of this application. As shown in FIG. 12, a subpixel sp is illustrated by using a shape of a light emitting region G, and one pixel region includes three subpixels: sp1, sp2, and sp3. In a pixel region P43 and a pixel region P44, light emitting regions G of corresponding subpixels sp1 have a same shape (as shown in the figure, all light emitting regions are in a circular shape), but adjacent light emitting regions G have different relative locations. Therefore, arrangement structures of light emitting regions of subpixels in the pixel region P43 and the pixel region P44 are different. In this embodiment, relative locations of two adjacent light emitting regions are adjusted to adjust an arrangement structure of light emitting regions of subpixels, so as to implement different structures of two adjacent pixel regions.

It should be noted that, if there is no conflict, in this embodiment of this application, one or more of a spacing distance between two adjacent light emitting regions, oblique angles of light emitting regions relative to a same edge of the display panel, a shape of a light emitting region, an area size of a light emitting region, and relative locations of two adjacent light emitting regions may be adjusted to adjust an arrangement structure of light emitting regions of subpixels in a pixel, so as to implement different structures of two adjacent pixel regions.

In some optional implementations, in the display panel provided in this embodiment of this application, in two adjacent pixel regions with different structures, at least one of the pixel regions includes a light shielding structure, the pixel region includes a light emitting region and a non-light-emitting region, one subpixel corresponds to one light emitting region, the non-light-emitting region surrounds the light emitting region, and the light shielding structure overlaps the non-light-emitting region. In the first display region, the light shielding structure can shield light that passes through the display panel, and the light shielding structure overlaps the non-light-emitting region. In this case, the arrangement of the light shielding structure in the pixel region can change a shape of a transparent region in the non-light-emitting region corresponding to the pixel region, so that a shape of a diffraction grating formed by the pixel region is changed, and two adjacent pixel regions correspondingly form different diffraction gratings. Further, this breaks a rule of a short-period diffraction grating that uses one pixel region as a period, mitigates a diffraction phenomenon caused by light passing through the display panel, and improves an optical effect of the under-screen optical element.

Figure 13:
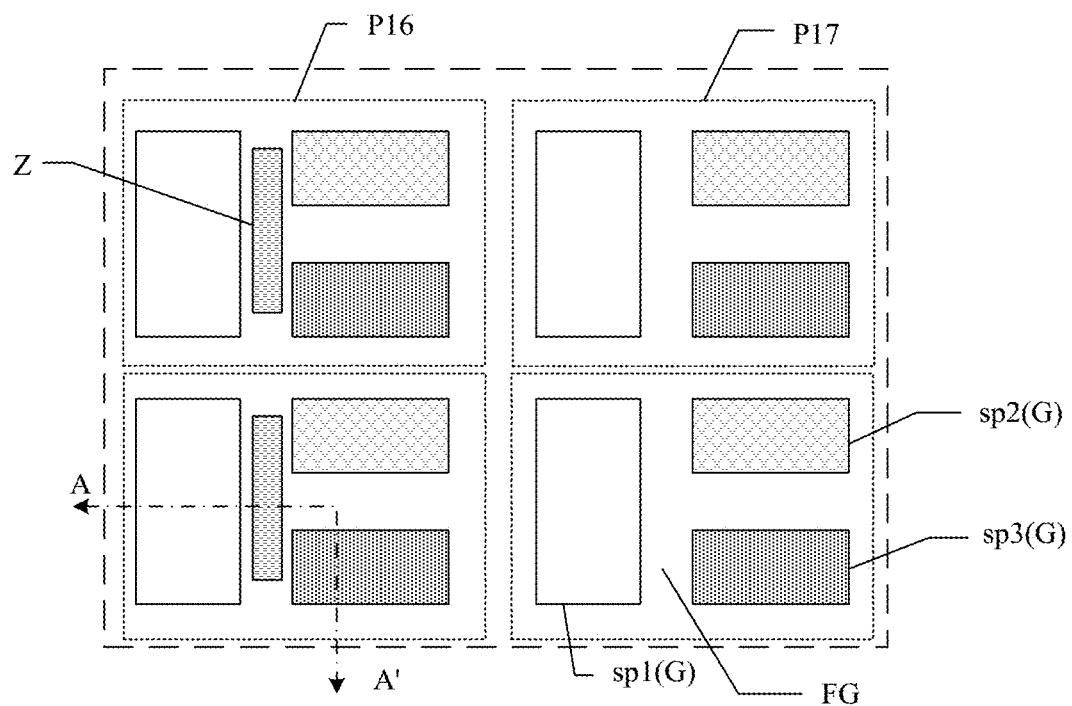
FIG. 13 is a partial schematic top view of another optional implementation of a first display region of a display panel according to an embodiment of this application.

In an embodiment, FIG. 13 is a partial schematic top view of another optional implementation of a first display region of a display panel according to an embodiment of this application. As shown in FIG. 13, a pixel region includes at least two light emitting regions G and non-light-emitting regions FG that surround the light emitting regions G, and one pixel region includes three subpixels: sp1, sp2, and sp3. In this case, in addition to light emitting regions G corresponding to three subpixels, a pixel region further includes non-light-emitting regions FG that surround the light emitting regions G. A pixel region P16 includes a light shielding structure Z, and the light shielding structure Z overlaps a non-light-emitting region FG. In the top view, it can be learned that the light shielding structure Z is located in the non-light-emitting region FG. The light shielding structure Z can shield light, thereby changing a shape of a transparent region in the non-light-emitting region FG corresponding to the pixel region P16, and changing a shape of a diffraction grating formed by the pixel region P16. A pixel region P17 adjacent to the pixel region P16 does not include a light shielding structure, and the pixel region P16 and the pixel region P17 have different structures. Therefore, diffraction gratings formed by the pixel region P16 and the pixel region P17 have different shapes. This can break a rule of a short-period diffraction grating that uses one pixel region as a period, and mitigate a diffraction phenomenon caused by light passing through the display panel.

Figure 14:
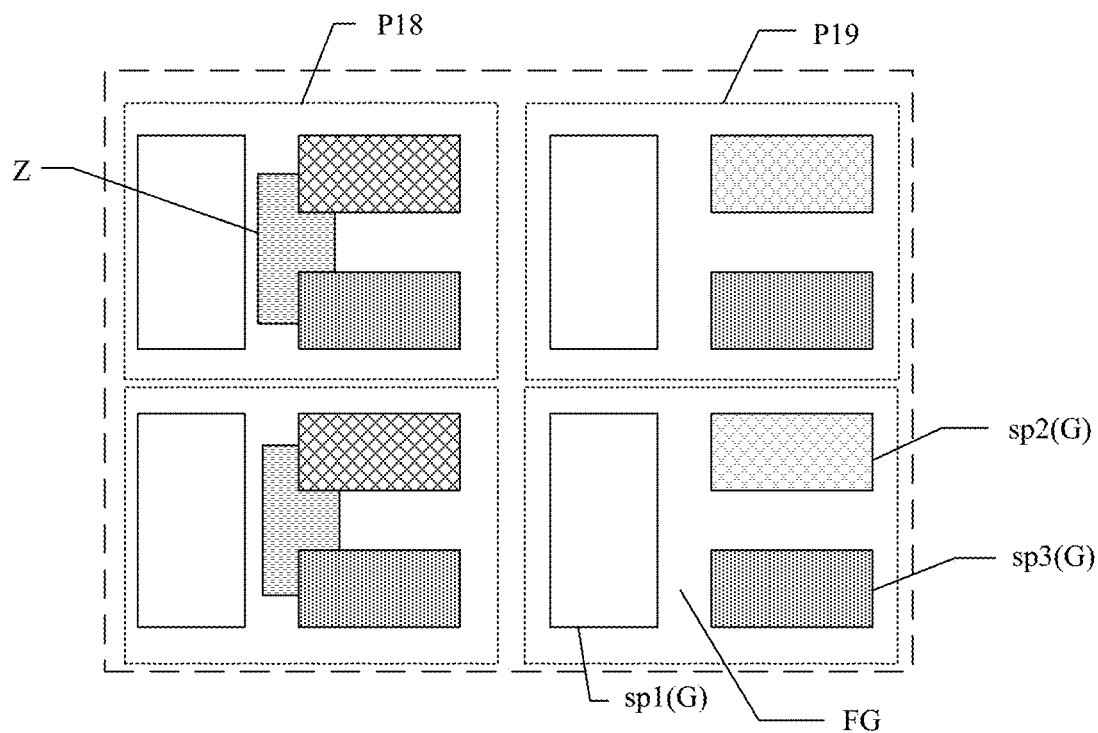
FIG. 14 is a partial schematic top view of another optional implementation of a first display region of a display panel according to an embodiment of this application.

FIG. 13 shows only one manner of disposing the light shielding structure. In another embodiment, FIG. 14 is a partial schematic top view of another optional implementation of a first display region of a display panel according to an embodiment of this application. A pixel region P18 includes a light shielding structure Z, and the light shielding structure Z overlaps a non-light-emitting region FG. A pixel region P19 adjacent to the pixel region P18 does not include a light shielding structure. Therefore, the pixel region P18 and the pixel region P19 have different structures. In this embodiment, a shape of the light shielding structure Z and relative locations of the light shielding structure Z and subpixels sp are different from those in FIG. 13. The light shielding structure Z overlaps the non-light-emitting region FG, and the shape of the light shielding structure Z and the relative locations of the light shielding structure Z and the subpixels affect a shape of a transparent region in the non-light-emitting region FG accordingly, thereby affecting a shape of a diffraction grating formed by a pixel region corresponding to the non-light-emitting region FG.

It should be noted that the arrangements of subpixels in a pixel region in FIG. 13 and FIG. 14 are merely used for illustration. In the display panel provided in this embodiment of this application, an area size of a light shielding structure in a pixel region, relative locations of a light shielding structure and a subpixel, a quantity of light shielding structures, and a shape of a light shielding structure are not limited.

Figure 15:
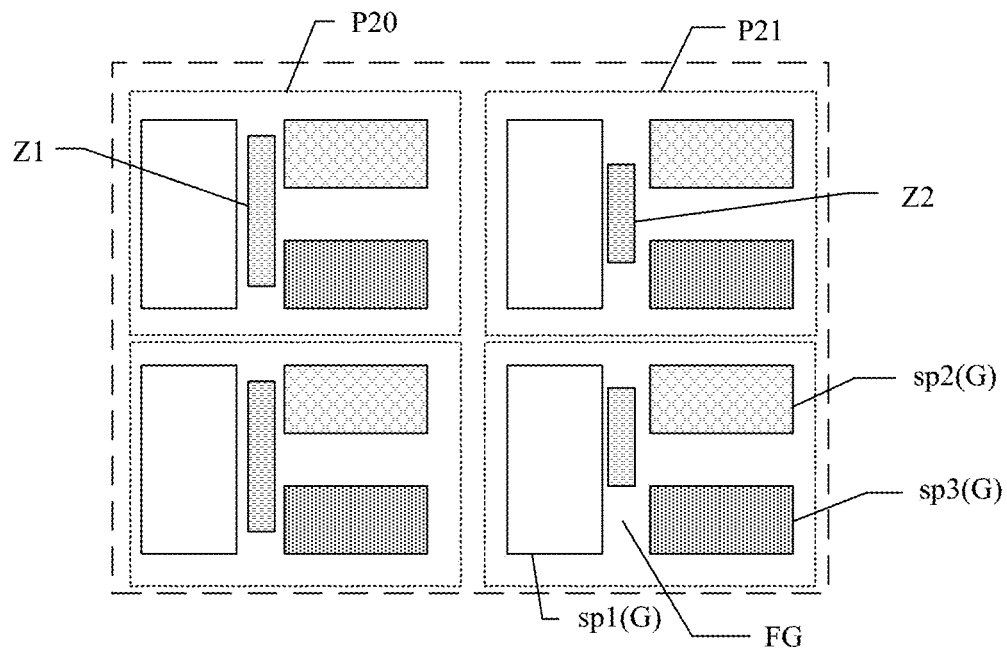
FIG. 15 is a partial schematic top view of another optional implementation of a first display region of a display panel according to an embodiment of this application.

In an embodiment, FIG. 15 is a partial schematic top view of another optional implementation of a first display region of a display panel according to an embodiment of this application. As shown in FIG. 15, a pixel region P20 includes a light shielding structure Z1, a pixel region P21 includes a light shielding structure Z2, and the light shielding structure Z1 and the light shielding structure Z2 have different area sizes. A light shielding structure overlaps a non-light-emitting region. Therefore, an area size of the light shielding structure affects an overlapping area of the light shielding structure and the non-light-emitting region, thereby affecting a shape of a transparent region in the non-light-emitting region, and further affecting a shape of a diffraction grating formed by a pixel region corresponding to the non-light-emitting region. In this embodiment, light shielding structures in two adjacent pixel regions have different area sizes, and therefore diffraction gratings formed by the two adjacent pixel regions have different shapes. This can break a rule of a short-period diffraction grating that uses one pixel region as a period, and mitigate a diffraction phenomenon caused by light passing through the display panel.

Figure 16:
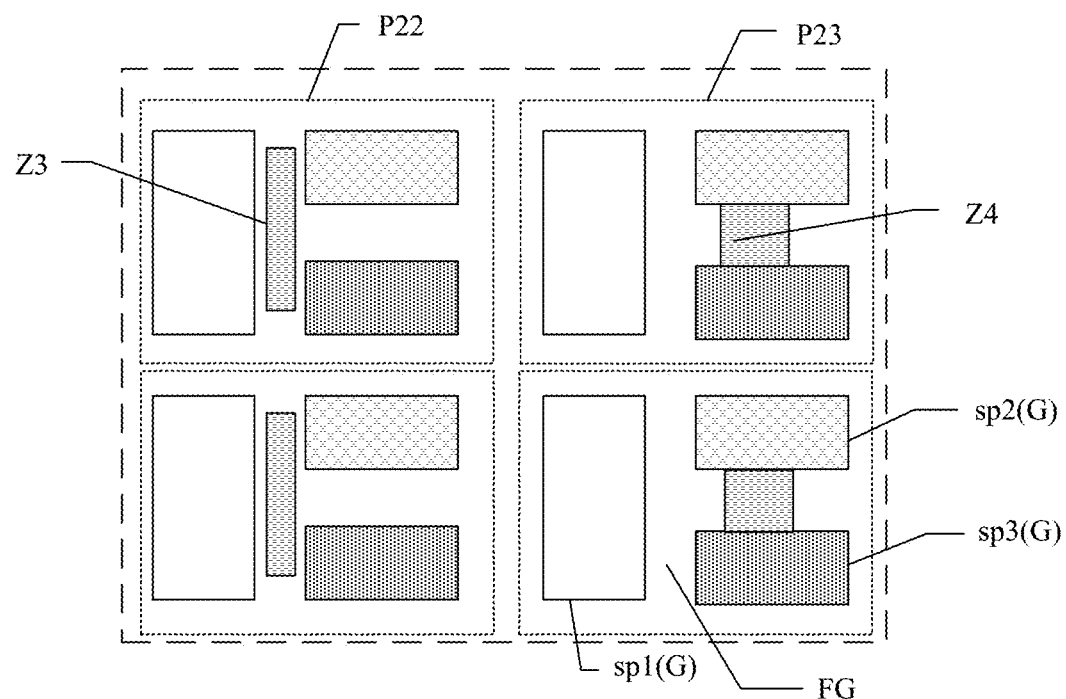
FIG. 16 is a partial schematic top view of another optional implementation of a first display region of a display panel according to an embodiment of this application.

In an embodiment, FIG. 16 is a partial schematic top view of another optional implementation of a first display region of a display panel according to an embodiment of this application. As shown in FIG. 16, a pixel region P22 includes a light shielding structure Z3, a pixel region P23 includes a light shielding structure Z4, relative locations of the light shielding structure Z3 and a light emitting region of a subpixel are different from relative locations of the light shielding structure Z4 and a light emitting region of a subpixel, and the adjacent pixel regions P22 and P23 have different structures. The light shielding structure overlaps a non-light-emitting region, and the relative locations of the light shielding structure and the light emitting region of the subpixel affect an overlapping location of the light shielding structure and the non-light-emitting region, thereby affecting a shape of a transparent region in the non-light-emitting region, and further affecting a shape of a diffraction grating formed by a pixel region corresponding to the non-light-emitting region. In this embodiment, relative locations of a light shielding structure and a light emitting region of a subpixel vary in two adjacent pixel regions. Therefore, shapes of diffraction gratings formed by the two adjacent pixel regions are different. This can break a rule of a short-period diffraction grating that uses one pixel region as a period, and mitigate a diffraction phenomenon caused by light passing through the display panel.

In an embodiment, two adjacent pixel regions with different structures each include a light shielding structure, and quantities of light shielding structures in the two pixel regions are different. A quantity of light shielding structures in a pixel region is not limited in this application. If quantities of light shielding structures are different, total overlapping locations of the light shielding structures and non-light-emitting regions are different, shapes of transparent regions in the non-light-emitting regions corresponding to the two adjacent pixel regions are different, and shapes of diffraction gratings formed by the two adjacent pixel regions are different. This can break a rule of a short-period diffraction grating that uses one pixel as a period.

In an embodiment, two adjacent pixel regions with different structures each include a light shielding structure, and the shapes of light shielding structures in the two pixel regions are different. A specific shape of a light shielding structure in a pixel region is not limited in this application. If the light shielding structure overlaps a non-light-emitting region, a shape of the light shielding structure can affect a shape of a transparent region in the non-light-emitting region. If the shapes of light shielding structures in two pixel regions are different, the shapes of diffraction gratings formed by two adjacent pixel regions are different. This can break a rule of a short-period diffraction grating that uses one pixel region as a period.

In the display panel provided in this embodiment of this application, a location of the light shielding structure in a film layer in the display panel includes a plurality of cases. The light shielding structure and an existing film layer structure in the display panel may be located at a same layer, or a film layer structure may be added to the display panel to fabricate the light shielding structure. The following embodiments describe a location of the light shielding structure in a film layer by using examples.

Figure 17:
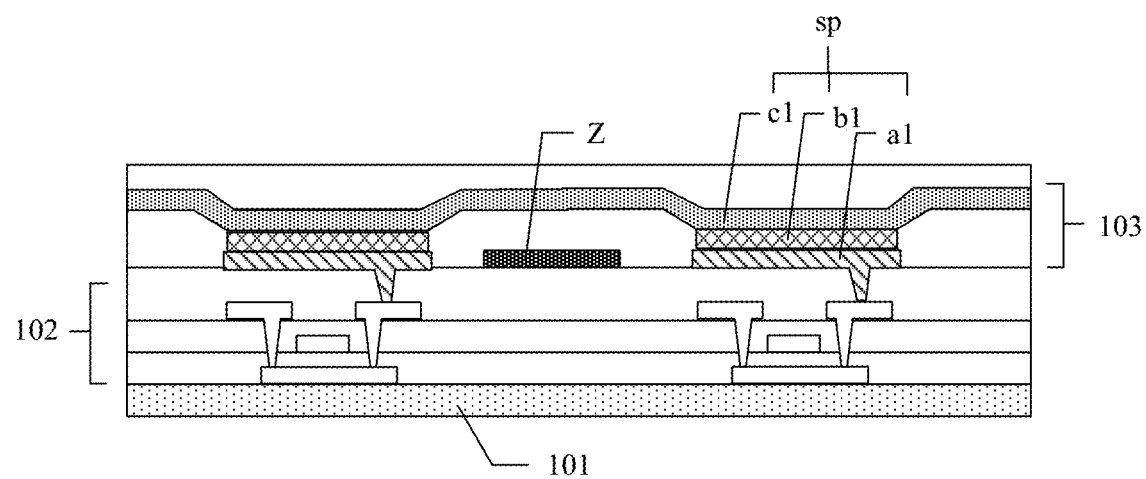
FIG. 17 is a schematic diagram of a film layer structure in an optional implementation at a location of a tangent line A-A' in FIG. 13.

In an embodiment, FIG. 17 is a schematic diagram of a film layer structure in an optional implementation at a location of a tangent line A-A' in FIG. 13. As shown in FIG. 17, the display panel includes a substrate 101, an array layer 102, and a display layer 103. For a partial film layer structure of the panel, refer to the descriptions of the embodiment corresponding to FIG. 5 for understanding. In this embodiment of this application, a subpixel sp includes a first electrode a1, a light emitting layer b1, and a second electrode c1 that are sequentially stacked. That is, one subpixel sp corresponds to one organic light emitting device. Optionally, the first electrode a1 is an anode, and the second electrode c1 is a cathode. The light shielding structure Z and the first electrode a1 are made of a same material at a same layer. During fabrication of the display panel, a whole layer of film layer material used for fabricating the first electrode is first laid, and then the film layer is etched by using an etching process to form both a pattern of the light shielding structure and a pattern of the first electrode. The light shielding structure is fabricated by reusing the fabrication process of the first electrode. Only a shape of a mask used for fabricating the first electrode needs to be designed, and no additional film layer structure needs to be added, so that a process is simple.

In the embodiment shown in FIG. 17, the light shielding structure Z is not connected to the first electrode a1. In another embodiment, the light shielding structure and the first electrode are made of a same material at a same layer, and a part of the light shielding structure is connected to the first electrode. In this embodiment, only a shape of a mask used for etching the first electrode needs to be designed, to fabricate the display panel.

Figure 18:
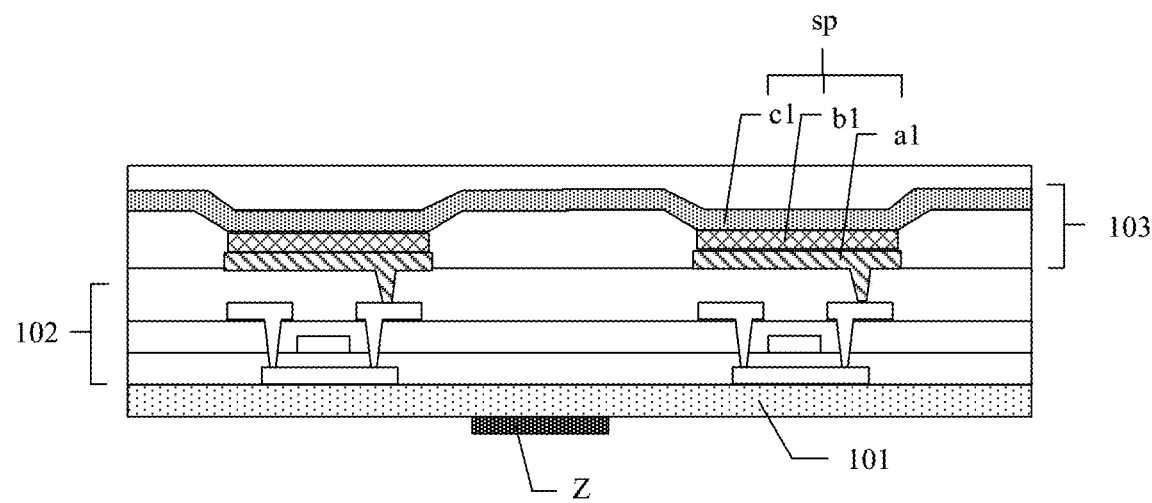
FIG. 18 is a schematic diagram of a film layer structure in another optional implementation at a location of a tangent line A-A' in FIG. 13.

In an embodiment, FIG. 18 is a schematic diagram of a film layer structure in another optional implementation at a location of a tangent line A-A' in FIG. 13. As shown in FIG. 18, the light shielding structure Z is located on a side, of the substrate 101, that is away from the array layer 102. In this embodiment, the light shielding structure Z may be attached to a rear surface of the substrate 101. Fabrication processes of the array layer 102 and the display layer 103 do not need to be changed for disposing the light shielding structure Z.

In an embodiment, the light shielding structure may be alternatively located between the substrate and the array layer. To be specific, during fabrication of the display panel, the light shielding structure is first fabricated on the substrate, and after a fabrication process of the light shielding structure is completed, a fabrication process of the array layer is started.

In some optional embodiments, the light shielding structure includes a light shield layer, and the light shielding structure may be made of an existing material that can absorb or reflect light. A material for fabricating the light shielding structure includes at least one or more of a metal, a metal oxide, and an organic polymer.

Further, in some optional implementations, in the display panel provided in this embodiment of this application, the first display region includes at least two repetition units arranged in an array, the repetition unit includes at least two pixel regions, and in one repetition unit, at least some adjacent pixel regions have different structures. A quantity of pixel regions in the repetition unit is not limited in this embodiment of this application. One repetition unit may include two pixel regions, three pixel regions, or more pixel regions. In one repetition unit, all pixel regions may be sequentially arranged in a specific direction, or all pixel regions may be arranged in an array. In one repetition unit, some adjacent pixel regions may have different structures, and some adjacent pixel regions have a same structure; or any two adjacent pixel regions may have different structures.

In this embodiment of this application, at least two repetition units arranged in an array are provided in the first display region, one repetition unit includes at least two pixel regions, and a period of a diffraction grating in the first display region is a length of one repetition unit. Compared with a related technology, this increases a period length of the diffraction grating, and implements short-range aperiodic and long-range periodic arrangement of pixel regions, thereby mitigating a diffraction phenomenon caused by light passing through the display panel, and improving an optical effect of the under-screen optical element. In addition, in an evaporation process of the light emitting layer in the display panel, a mask used in the evaporation process is quite thin, and the pixel definition layer supports the mask to some extent. In this embodiment of this application, the repetition units are arranged in an array, and therefore openings of the pixel definition layer are also arranged in an array by using one repetition unit as a period. This can ensure that the mask is subject to a uniform force in the evaporation process, thereby meeting a flatness requirement of the mask and ensuring reliability of the evaporation process.

Figure 19:
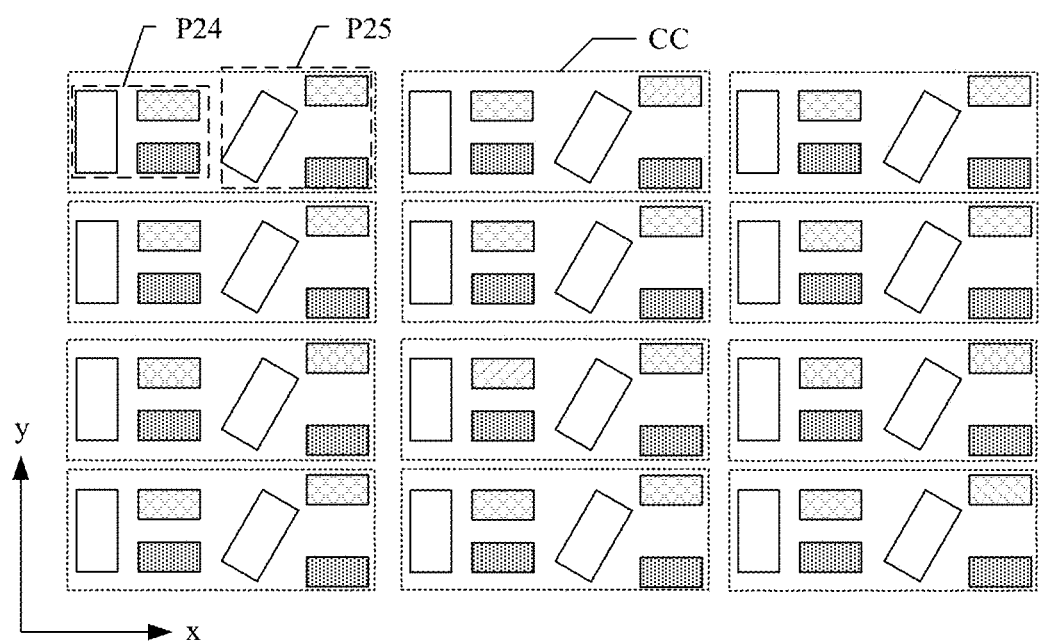
FIG. 19 is a partial schematic top view of another optional implementation of a first display region of a display panel according to an embodiment of this application.

In an embodiment, the repetition unit includes two pixel regions. FIG. 19 is a partial schematic top view of another optional implementation of a first display region of a display panel according to an embodiment of this application. As shown in FIG. 19, a repetition unit CC includes two pixel regions: a pixel region P24 and a pixel region P25. The pixel region P24 and the pixel region P25 have different structures. A plurality of repetition units CC are sequentially arranged in a first direction x, and a plurality of repetition units CC are sequentially arranged in a second direction y, that is, a plurality of repetition units CC are arranged in an array in the first display region.

Figure 20:
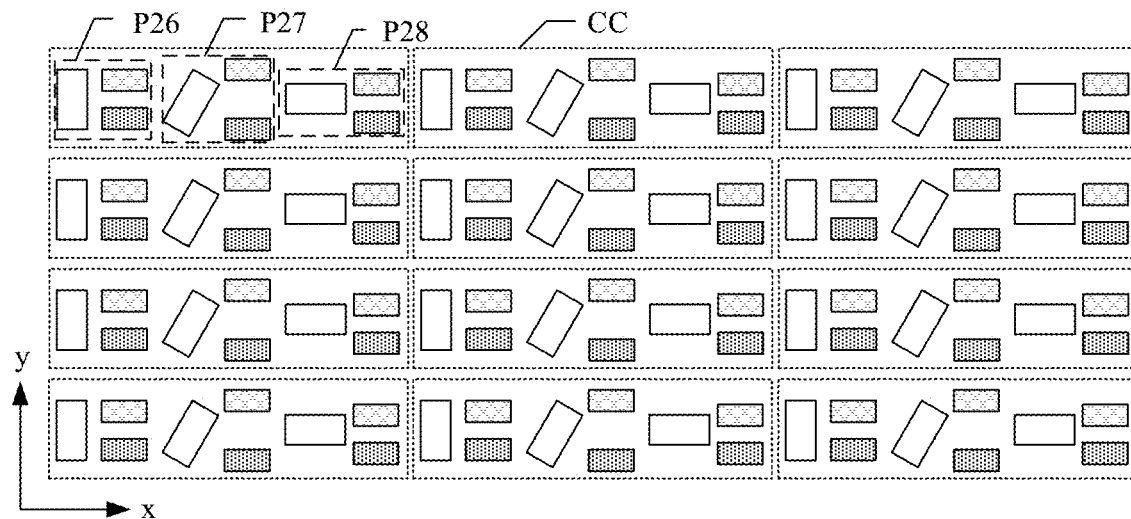
FIG. 20 is a partial schematic top view of another optional implementation of a first display region of a display panel according to an embodiment of this application.

In an embodiment, the repetition unit includes three pixel regions. FIG. 20 is a partial schematic top view of another optional implementation of a first display region of a display panel according to an embodiment of this application. As shown in FIG. 20, a repetition unit CC includes three pixel regions: a pixel region P26, a pixel region P27, and a pixel region P28. The adjacent pixel regions P26 and P27 have different structures, and the adjacent pixel regions P27 and P28 also have different structures. A plurality of repetition units CC are sequentially arranged in a first direction x, and a plurality of repetition units CC are sequentially arranged in a second direction y, that is, a plurality of repetition units CC are arranged in an array in the first display region.

In the embodiment of FIG. 20, the repetition unit is understood as having an "ABC" structure, that is, any two adjacent pixel regions in the repetition unit have different structures. When the repetition unit includes three pixel regions, in some optional embodiments, the repetition unit may alternatively have an "ABB" structure, or may have an "AAB" structure, that is, in the repetition unit, some adjacent pixel regions have different structures, and remaining adjacent pixel regions have a same structure. This is not shown in the figure herein.

Figure 21:
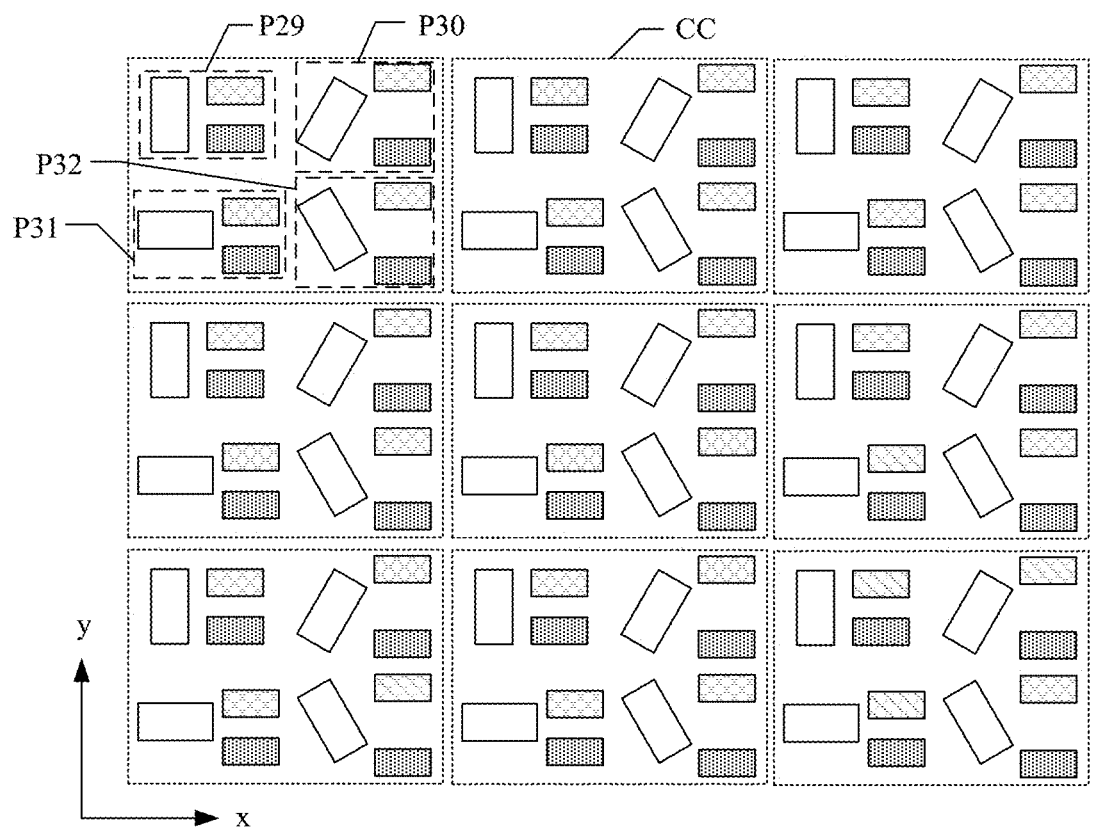
FIG. 21 is a partial schematic top view of another optional implementation of a first display region of a display panel according to an embodiment of this application.

In an embodiment, the repetition unit includes four pixel regions. FIG. 21 is a partial schematic top view of another optional implementation of a first display region of a display panel according to an embodiment of this application. As shown in FIG. 21, a repetition unit CC includes four pixel regions: a pixel region P29, a pixel region P30, a pixel region P31, and a pixel region P32. Any two adjacent pixel regions in the repetition unit CC have different structures. A plurality of repetition units CC are sequentially arranged in a first direction x, and a plurality of repetition units CC are sequentially arranged in a second direction y, that is, a plurality of repetition units CC are arranged in an array in the first display region.

As shown in the embodiment of FIG. 21, any two adjacent pixel regions in a repetition unit have different structures. When the repetition unit includes four pixel regions, in some optional embodiments, some adjacent pixel regions may have different structures, and remaining adjacent pixel regions have a same structure.

In some optional implementations, at least two pixel regions in the repetition unit are arranged in an array, and at least some pixel regions have a same structure as that of adjacent pixel regions in diagonal directions of the pixel regions. Optionally, all pixel regions in the repetition unit are arranged in an "n×m" array, where n≥2, m≥2, and both n and m are integers. In this embodiment, repetition units are provided in the first display region, so that a period of a diffraction grating in the first display region is a length of one repetition unit. This increases a period length of the diffraction grating, and implements a short-range aperiodic and long-range periodic structure of pixel regions, thereby mitigating a diffraction phenomenon caused by light passing through the display panel, and improving an optical effect of the under-screen optical element. In addition, at least some pixel regions in the repetition unit are set to have a same structure as that of adjacent pixel regions in diagonal directions of the pixel regions. Therefore, some adjacent pixel regions in the repetition unit have different structures, and remaining adjacent pixel regions have a same structure. For example, the repetition unit includes four pixel regions arranged in an array, and two pixel regions that are adjacent in a diagonal direction may be set to have a same structure. During design, at least two different pixel region structures may be designed to constitute one repetition unit. This implementation can reduce design types of pixel region structures on a basis of mitigating a diffraction phenomenon, thereby helping reduce design difficulty of a mask used during fabrication.

Figure 22:
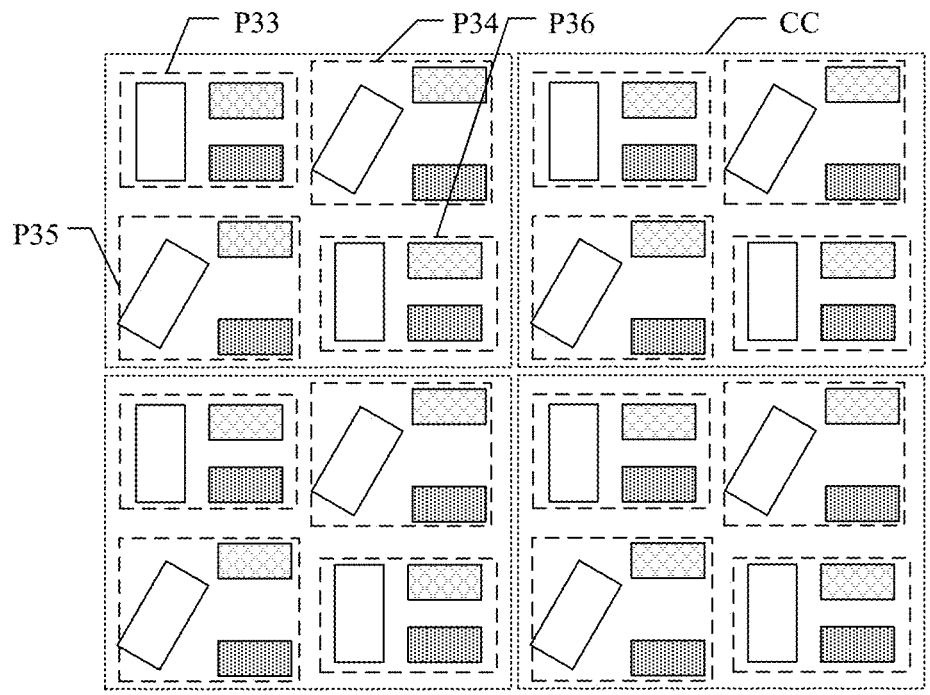
FIG. 22 is a partial schematic top view of another optional implementation of a first display region of a display panel according to an embodiment of this application.

In an embodiment, for example, the repetition unit includes four pixel regions. FIG. 22 is a partial schematic top view of another optional implementation of a first display region of a display panel according to an embodiment of this application. As shown in FIG. 22, a repetition unit CC includes four pixel regions arranged in an array: a pixel region P33, a pixel region P34, a pixel region P35, and a pixel region P36. The pixel region P33 and the pixel region P36 that are adjacent in a diagonal direction have a same structure. The pixel region P34 and the pixel region P35 that are adjacent in a diagonal direction have a same structure.

Figure 23:
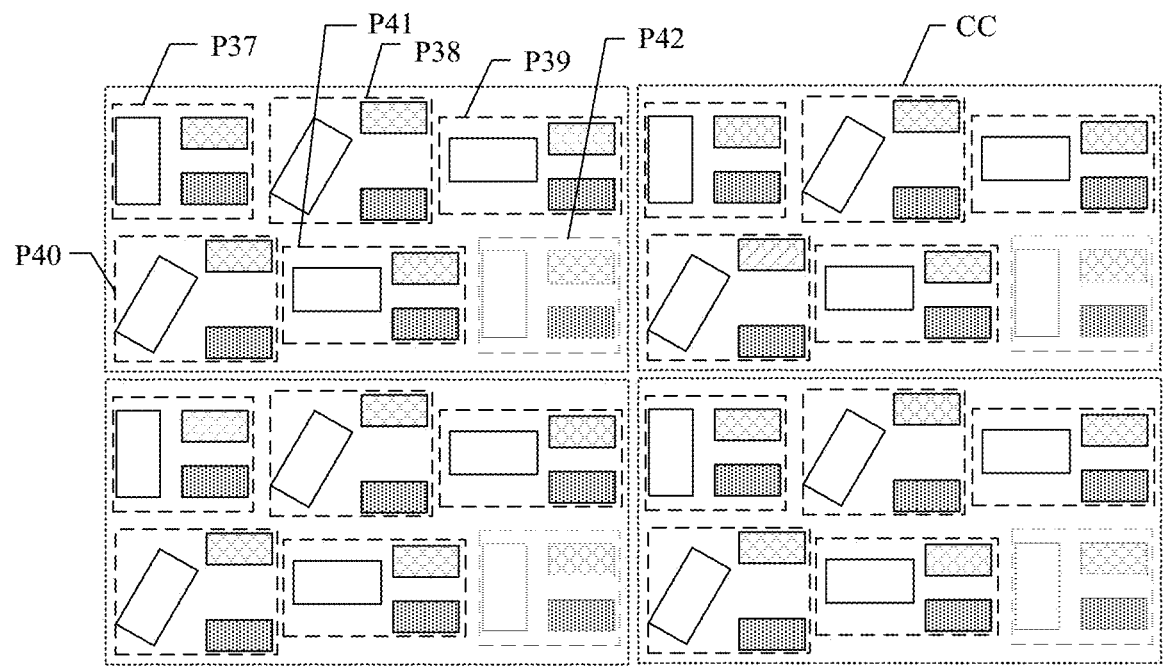
FIG. 23 is a partial schematic top view of another optional implementation of a first display region of a display panel according to an embodiment of this application.

In an embodiment, for example, the repetition unit includes six pixel regions. FIG. 23 is a partial schematic top view of another optional implementation of a first display region of a display panel according to an embodiment of this application. As shown in FIG. 23, a repetition unit CC includes six pixel regions arranged in a "2×3" array: a pixel region P37, a pixel region P38, a pixel region P39, a pixel region P40, a pixel region P41, and a pixel region P42. The pixel region P40 and the pixel region P38 that are adjacent in a diagonal direction have a same structure. The pixel region P41 and the pixel region P39 that are adjacent in a diagonal direction have a same structure. This embodiment shows a case in which, in one repetition unit, some adjacent pixel regions have different structures, and remaining adjacent pixel regions have a same structure.

In some optional implementations, in the first display region, any two adjacent pixel regions have different structures. In an embodiment, with reference to FIG. 21, the repetition units CC are arranged in an array in the first display region, and any two adjacent pixel regions in the repetition unit CC have different structures. In this embodiment, it can be ensured that pixel regions in the first display region are still arranged according to a specific rule, to form a long-period diffraction grating that uses one repetition unit as a period. In another embodiment, in the first display region, any two adjacent pixel regions have different structures, and pixel regions are arranged irregularly, so that an aperiodic diffraction grating can be formed. In this embodiment, the first display region may include pixel regions with a same structure, but these pixel regions with a same structure are not adjacent.

It should be noted that FIG. 19 to FIG. 23 are merely intended to describe a plurality of ways to arrange pixel regions in the repetition unit in this embodiment of this application. Shapes of subpixels in a pixel region and the arrangements of the subpixels in the pixel region in FIG. 19 to FIG. 23 are not intended to limit this application.

In some optional implementations, in the display panel provided in this embodiment of this application, an arrangement structure of signal lines in a pixel region in the first display region is changed to implement different structures of two adjacent pixel regions. The pixel region includes a light emitting region and a non-light-emitting region, one subpixel corresponds to one light emitting region, and the non-light-emitting region surrounds the light emitting region. The display region further includes at least two signal lines, and the signal line includes a first signal line segment located in the non-light-emitting region. In the first display region, two adjacent pixel regions with different structures differ in at least one of the following: a line width of the first signal line segment; a line shape of the first signal line segment; and a spacing between two adjacent first signal line segments. The line width is a width of the first signal line segment in a direction perpendicular to an extension direction of the first signal line segment. If the line width varies, an area occupied by the first signal line segment in the non-light-emitting region varies. The line shape of the first signal line segment is a shape of the first signal line segment, for example, a straight line shape, a curved shape, a wavy line shape, or a broken line shape.

The signal lines in this embodiment of this application include a signal line that is in the display panel and that is configured to drive the display panel to perform display, and a signal line that supports another function (such as a touch control function) of the display panel. A plurality of signal lines include signal lines such as a data line, a scanning line, a power signal line, a reset signal line, and a touch signal line, and a signal line in a pixel drive circuit. In the implemented display panel, some signal lines overlap the light emitting region, and some signal lines overlap the non-light-emitting region. In the display panel to which the solution of the under-screen optical element is applied, some signal lines that overlap the non-light-emitting region also form a diffraction grating, to diffract light that passes through the display panel. In this embodiment of this application, an arrangement structure of the signal line that overlaps the non-light-emitting region (that is, the first signal line segment located in the non-light-emitting region) is adjusted, to implement different structures of two adjacent pixel regions, so that diffraction gratings formed by the two adjacent pixel regions have different shapes.

Figure 24:
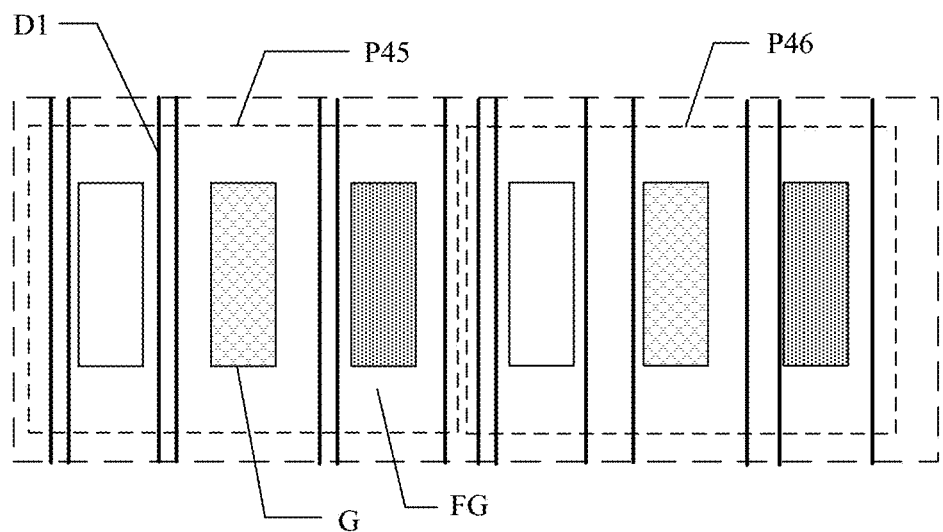
FIG. 24 is a partial schematic top view of another optional implementation of a first display region of a display panel according to an embodiment of this application.

Specifically, in an embodiment, for example, a spacing between two adjacent first signal line segments varies in two adjacent pixel regions. FIG. 24 is a partial schematic top view of another optional implementation of a first display region of a display panel according to an embodiment of this application. As shown in FIG. 24, one pixel region includes three light emitting regions G, and further includes non-light-emitting regions FG that surround the light emitting regions G. The pixel region includes a first signal line segment D1 located in a non-light-emitting region FG, and a spacing between two adjacent first signal line segments D1 located in a non-light-emitting region FG varies in a pixel region P45 and a pixel region P46. Therefore, transparent regions of the adjacent pixel regions P45 and P46 have different shapes. In this implementation, an arrangement structure of first signal line segments in pixel regions can be adjusted, so that transparent regions of two adjacent pixel regions are different, and the two adjacent pixel regions further form different diffraction gratings. This breaks a rule of a periodic diffraction grating that uses a length of one pixel region as a period.

Further, in some optional implementations, an arrangement structure of first signal line segments located in non-light-emitting regions of pixels are adjusted to implement different structures of two adjacent pixel regions. In this way, at least two pixel regions can constitute a repetition unit, and repetition units are arranged in an array in the first display region to form a diffraction grating that uses a length of one repetition unit as a period, and implement short-range aperiodic and long-range periodic arrangement of pixel regions. This can mitigate a diffraction phenomenon caused by light passing through the display panel, and improve an optical effect of the under-screen optical element. In addition, the periodic arrangement of the pixel regions can ensure that a mask is subject to a uniform force in an evaporation process, thereby meeting a flatness requirement of the mask and ensuring reliability of the evaporation process.

Figure 25:
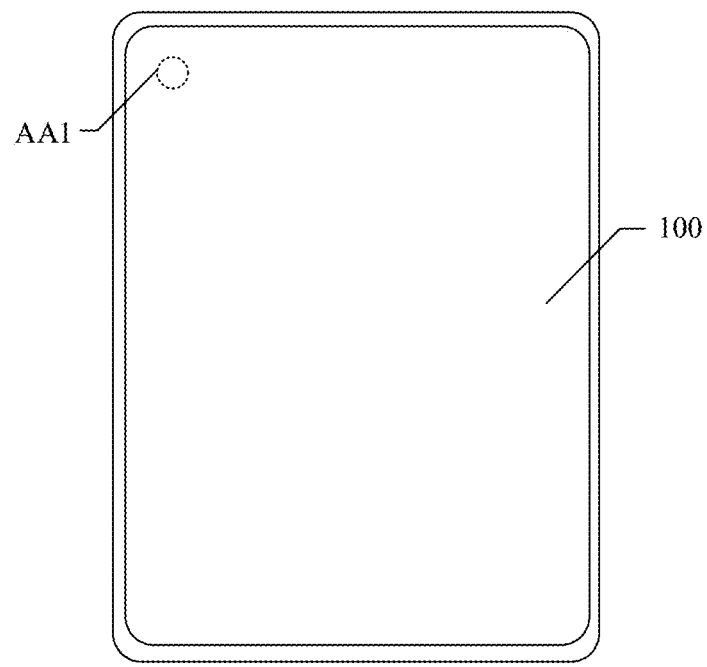
FIG. 25 is a schematic diagram of an electronic device according to an embodiment of this application.

It should be noted that, if there is no conflict, in this embodiment of this application, the solution of disposing a light shielding structure to adjust a structure in a pixel region, the solution of adjusting an arrangement of light emitting regions of subpixels in a pixel region, and the solution of adjusting an arrangement structure of first signal line segments in a pixel region may be combined with each other to implement different structures of two adjacent pixel regions. Based on a same inventive concept, this application further provides an electronic device. FIG. 25 is a schematic diagram of an electronic device according to an embodiment of this application. As shown in FIG. 25, the electronic device includes the display panel 100 provided in any embodiment of this application, and the electronic device further includes an optical element (not shown). The optical element is located under the first display region AA1. The optical element may be one or more of a camera, an optical fingerprint sensor, a structured optical transmitter, a structured optical receiver, an optical proximity transmitter, an optical proximity receiver, and a time of flight device. A specific structure of the display panel 100 is described in detail in the foregoing embodiments. Details are not described herein again. Certainly, the electronic device shown in FIG. 25 is merely an example for description. The electronic device may be any electronic device with a display function, for example, a mobile phone, a tablet computer, a notebook computer, an e-book, or a television.

The foregoing descriptions are merely example embodiments of the present invention, but are not intended to limit the present invention. Any modification, equivalent replacement, or improvement made within the spirit and principle of the present invention should fall within the protection scope of the present invention.

What is claimed is:

1. A display panel comprising:
a display area comprising a first display region and a second display region, the first display region corresponding to a location of an optical element disposed beneath the display area;
wherein the first display region comprises a plurality of repetition units arranged in an array, each repetition unit comprises a first pixel region and a second pixel region, wherein a structure of the first pixel region is different from a structure of the second pixel region, and
wherein a light shielding structure is configured in the display panel by adding a film layer structure to the display panel, the light shielding structure corresponding to one of the first and second pixel regions, and wherein the light shielding structure is configured to change a shape of a transparent region in the display panel, and change a shape of a diffraction grating formed by the corresponding pixel region.

2. The display panel of claim 1, wherein the first pixel region comprises a first subpixel for emitting red light, a second subpixel for emitting blue light, and a third subpixel for emitting green light.

3. The display panel of claim 2, wherein the second pixel region comprises a fourth subpixel for emitting red light, a fifth subpixel for emitting blue light, and a sixth subpixel for emitting green light.

4. The display panel of claim 2, wherein shapes of the first subpixel, the second subpixel and the third subpixel are different.

5. The display panel of claim 3, wherein the first pixel region and the second pixel region each comprises four subpixels.

6. The display panel of claim 5, wherein an arrangement of subpixels of the first pixel region is different from an arrangement of subpixels of the second pixel region.

7. The display panel of claim 5, wherein some of the subpixels in the first pixel region are the same shape, and/or some of the subpixels in the second pixel region are the same shape.

8. The display panel of claim 6, wherein one subpixel corresponds to one light emitting region, wherein the arrangement of subpixels of the first pixel region is different from the arrangement of subpixels of the second pixel region further comprises at least one of the following:
the light emitting regions have different shapes;
the light emitting regions have different area sizes;
adjacent light emitting regions have different relative locations;
adjacent light emitting regions have different spacing distances; and
oblique angles of the light emitting regions relative to a same edge of the display panel are different.

9. The display panel of claim 1, wherein the light shielding structure comprises a metal.

10. The display panel of claim 1, wherein the second display region half-surrounds the first display region.

11. The display panel of claim 1, wherein adjacent pixel regions in the second display region have a same structure.

12. The display panel of claim 1, wherein a subpixel density of the first display region is less than a subpixel density of the second display region.

13. An electronic device comprising;
a display panel and an optical element, wherein the optical element is located under the display panel, wherein a display area of the display panel comprises a first display region and a second display region, and the first display region corresponds to a location of the optical element;
wherein the first display region comprises a plurality of repetition units arranged in an array, each repetition unit comprising a first pixel region and a second pixel region, wherein a structure of the first pixel region is different from a structure of the second pixel region, and
wherein a light shielding structure is configured in the display panel by adding a film layer structure to the display panel, the light shielding structure corresponding to one of the first and second pixel regions, and wherein the light shielding structure is configured to change a shape of a transparent region in the display panel, and change a shape of a diffraction grating formed by the corresponding pixel region.

14. The electronic device of claim 13, wherein the first pixel region and the second pixel region each comprises four subpixels.

15. The electronic device of claim 14, wherein an arrangement of subpixels of the first pixel region is different from an arrangement of subpixels of the second pixel region.

16. The electronic device of claim 14, wherein shapes of the first subpixel, the second subpixel and the third subpixel are different.

17. The electronic device of claim 15, wherein one subpixel corresponds to one light emitting region, and the arrangement of the subpixels of the first pixel region is different from the arrangement of the subpixels of the second pixel region further comprises at least one of the following:
the light emitting regions have different shapes;
the light emitting regions have different area sizes;
adjacent light emitting regions have different relative locations;
adjacent light emitting regions have different spacing distances; and
oblique angles of the light emitting regions relative to a same edge of the display panel are different.

18. The electronic device of claim 13, wherein the light shielding structure comprises a metal.

19. The electronic device of claim 13, wherein the second display region half-surrounds the first display region.

20. The electronic device of claim 13, wherein adjacent pixel regions in the second display region have a same structure.

* * * * *